US 9,927,718 B2

(12) United States Patent
Kandel et al.

(10) Patent No.: US 9,927,718 B2
(45) Date of Patent: Mar. 27, 2018

(54) MULTI-LAYER OVERLAY METROLOGY TARGET AND COMPLIMENTARY OVERLAY METROLOGY MEASUREMENT SYSTEMS

(75) Inventors: Daniel Kandel, Aseret (IL); Vladimir Levinski, Nazareth Ilit (IL); Guy Cohen, Yaad (IL)

(73) Assignee: KLA-Tencor Corporation, Milpitas, CA (US)

(*) Notice: Subject to any disclaimer, the term of this patent is extended or adjusted under 35 U.S.C. 154(b) by 381 days.

(21) Appl. No.: 13/186,144

(22) Filed: Jul. 19, 2011

(65) Prior Publication Data

US 2012/0033215 A1    Feb. 9, 2012

Related U.S. Application Data

(60) Provisional application No. 61/370,341, filed on Aug. 3, 2010.

(51) Int. Cl.
  *G01J 4/00* (2006.01)
  *G03F 7/20* (2006.01)
(52) U.S. Cl.
  CPC ...... *G03F 7/70633* (2013.01); *G03F 7/70683* (2013.01)
(58) Field of Classification Search
  CPC .................. G03F 7/70633; G03F 7/70683
  USPC ........... 356/399–401; 355/53, 77; 430/5, 22, 430/30; 438/401; 257/797; 382/151
  See application file for complete search history.

(56) References Cited

U.S. PATENT DOCUMENTS

| | | |
|---|---|---|
| 4,166,219 A | 8/1979 | Ausschnitt et al. |
| 4,251,160 A | 2/1981 | Bouwhuis et al. |
| 4,290,384 A | 9/1981 | Ausschnitt et al. |
| 4,437,760 A | 3/1984 | Ausschnitt |
| 4,475,811 A | 10/1984 | Brunner |

(Continued)

FOREIGN PATENT DOCUMENTS

| | | |
|---|---|---|
| CN | 101114130 A | 1/2008 |
| EP | 0818814 A2 | 1/1998 |

(Continued)

OTHER PUBLICATIONS

U.S. Appl. No. 10/367,124, filed Feb. 13, 2003; Office Action dated Apr. 23, 200.

(Continued)

*Primary Examiner* — Hina F Ayub
(74) *Attorney, Agent, or Firm* — Suiter Swantz pc llo

(57) ABSTRACT

A multi-layer overlay target for use in imaging based metrology is disclosed. The overlay target includes a plurality of target structures including three or more target structures, each target structure including a set of two or more pattern elements, wherein the target structures are configured to share a common center of symmetry upon alignment of the target structures, each target structure being invariant to N degree rotation about the common center of symmetry, wherein N is equal to or greater than 180 degrees, wherein each of the two or more pattern elements has an individual center of symmetry, wherein each of the two or more pattern elements of each target structure is invariant to M degree rotation about the individual center of symmetry, wherein M is equal to or greater than 180 degrees.

24 Claims, 13 Drawing Sheets

(56) References Cited

U.S. PATENT DOCUMENTS

| | | |
|---|---|---|
| 4,538,105 A | 8/1985 | Ausschnitt |
| 4,568,189 A | 2/1986 | Bass et al. |
| 4,703,434 A | 10/1987 | Brunner |
| 4,714,874 A | 12/1987 | Morris et al. |
| 4,757,207 A * | 7/1988 | Chappelow et al. ...... 250/491.1 |
| 4,757,707 A | 7/1988 | Harvey et al. |
| 4,778,275 A | 10/1988 | van den Brink et al. |
| 4,782,288 A | 11/1988 | Vento |
| 4,818,110 A | 4/1989 | Davidson |
| 4,820,055 A | 4/1989 | Muller |
| 4,848,911 A | 7/1989 | Uchida et al. |
| 4,855,253 A | 8/1989 | Weber |
| 4,890,239 A | 12/1989 | Ausschnitt et al. |
| 4,929,083 A | 5/1990 | Brunner |
| 5,017,514 A | 5/1991 | Nishimoto |
| 5,100,237 A | 3/1992 | Wittekoek et al. |
| 5,112,129 A | 5/1992 | Davidson et al. |
| 5,148,214 A | 9/1992 | Ohta et al. |
| 5,156,982 A | 10/1992 | Nagoya |
| 5,172,190 A | 12/1992 | Kaiser |
| 5,216,257 A | 6/1993 | Brueck et al. |
| 5,262,258 A | 11/1993 | Yanagisawa |
| 5,296,917 A | 3/1994 | Kusonose et al. |
| 5,300,786 A | 4/1994 | Brunner et al. |
| 5,343,292 A | 8/1994 | Brueck et al. |
| 5,383,136 A | 1/1995 | Cresswell et al. |
| 5,414,514 A | 5/1995 | Smith et al. |
| 5,436,097 A | 7/1995 | Norishima et al. |
| 5,438,413 A | 8/1995 | Mazor et al. |
| 5,477,057 A | 12/1995 | Angeley et al. |
| 5,479,270 A | 12/1995 | Taylor |
| 5,481,362 A | 1/1996 | Van Den Brink et al. |
| 5,498,501 A | 3/1996 | Shimoda et al. |
| 5,545,593 A | 8/1996 | Watkins et al. |
| 5,596,413 A | 1/1997 | Stanton et al. |
| 5,604,819 A | 2/1997 | Barnard |
| 5,617,340 A | 4/1997 | Cresswell et al. |
| 5,627,083 A | 5/1997 | Tounai et al. |
| 5,629,772 A | 5/1997 | Ausschnitt |
| 5,665,495 A | 9/1997 | Hwang |
| 5,674,650 A | 10/1997 | Dirksen et al. |
| 5,699,282 A | 12/1997 | Allen et al. |
| 5,701,013 A | 12/1997 | Hsia et al. |
| 5,702,567 A | 12/1997 | Mitsui et al. |
| 5,703,685 A | 12/1997 | Senda et al. |
| 5,712,707 A | 1/1998 | Ausschnitt et al. |
| 5,731,877 A | 3/1998 | Ausschnitt |
| 5,756,242 A | 5/1998 | Koizumi et al. |
| 5,757,507 A | 5/1998 | Ausschnitt et al. |
| 5,766,809 A | 6/1998 | Bae |
| 5,776,645 A | 7/1998 | Barr et al. |
| 5,783,342 A | 7/1998 | Yamashita et al. |
| 5,790,254 A | 8/1998 | Ausschnitt |
| 5,805,290 A | 9/1998 | Ausschnitt et al. |
| 5,835,196 A | 11/1998 | Jackson |
| 5,857,258 A | 1/1999 | Penzes et al. |
| 5,863,680 A | 1/1999 | Kawakubo et al. |
| 5,872,042 A | 2/1999 | Hsu et al. |
| 5,877,036 A | 3/1999 | Kawai |
| 5,877,861 A | 3/1999 | Ausschnitt et al. |
| 5,902,703 A | 5/1999 | Leroux et al. |
| 5,912,983 A | 6/1999 | Hiratsuka |
| 5,914,784 A | 6/1999 | Ausschnitt et al. |
| 5,923,041 A | 7/1999 | Cresswell et al. |
| 5,928,822 A | 7/1999 | Rhyu |
| 5,939,226 A | 8/1999 | Tomimatu |
| 5,949,145 A | 9/1999 | Komuro |
| 5,949,547 A | 9/1999 | Tseng et al. |
| 5,952,134 A | 9/1999 | Hwang |
| 5,952,241 A | 9/1999 | Baker et al. |
| 5,953,128 A | 9/1999 | Ausschnitt et al. |
| 5,960,125 A | 9/1999 | Michael et al. |
| 5,965,309 A | 10/1999 | Ausschnitt et al. |
| 5,968,693 A | 10/1999 | Adams |
| 5,976,740 A | 11/1999 | Ausschnitt et al. |
| 5,981,119 A | 11/1999 | Adams |
| 5,985,495 A | 11/1999 | Okumura et al. |
| 6,003,223 A | 12/1999 | Hagen et al. |
| 6,004,706 A | 12/1999 | Ausschnitt et al. |
| 6,020,966 A | 2/2000 | Ausschnitt et al. |
| 6,023,338 A | 2/2000 | Bareket |
| 6,027,842 A | 2/2000 | Ausschnitt et al. |
| 6,037,671 A | 3/2000 | Kepler et al. |
| 6,042,976 A | 3/2000 | Chiang et al. |
| 6,061,119 A | 5/2000 | Ota |
| 6,061,606 A | 5/2000 | Ross |
| 6,077,756 A | 6/2000 | Lin et al. |
| 6,079,256 A | 6/2000 | Bareket |
| 6,084,679 A | 7/2000 | Steffan et al. |
| 6,118,185 A | 9/2000 | Chen et al. |
| 6,128,089 A | 10/2000 | Ausschnitt et al. |
| 6,130,750 A | 10/2000 | Ausschnitt et al. |
| 6,137,578 A | 10/2000 | Ausschnitt |
| 6,140,217 A | 10/2000 | Jones et al. |
| 6,146,910 A | 11/2000 | Cresswell et al. |
| 6,160,622 A | 12/2000 | Dirksen et al. |
| 6,165,656 A | 12/2000 | Tomimatu |
| 6,172,349 B1 | 1/2001 | Katz et al. |
| 6,183,919 B1 | 2/2001 | Auschnitt et al. |
| 6,218,200 B1 * | 4/2001 | Chen et al. ...................... 438/14 |
| 6,317,211 B1 | 11/2001 | Ausschnitt et al. |
| 6,335,151 B1 | 1/2002 | Ausschnitt et al. |
| 6,346,979 B1 | 2/2002 | Ausschnitt et al. |
| 6,350,548 B1 | 2/2002 | Leidy et al. |
| 6,384,899 B1 | 5/2002 | den Boef |
| 6,405,096 B1 | 6/2002 | Toprac et al. |
| 6,417,929 B1 | 7/2002 | Ausschnitt et al. |
| 6,429,667 B1 | 8/2002 | Ausschnitt et al. |
| 6,457,169 B1 | 9/2002 | Ross |
| 6,460,265 B2 | 10/2002 | Pogge et al. |
| 6,462,818 B1 | 10/2002 | Bareket |
| 6,612,159 B1 | 9/2003 | Knutrud |
| 6,638,671 B2 | 10/2003 | Ausschnitt |
| 6,664,121 B2 | 12/2003 | Grodnesky et al. |
| 6,675,053 B2 | 1/2004 | Baluswamy et al. |
| 6,734,549 B2 | 5/2004 | Takeoka et al. |
| 6,734,971 B2 | 5/2004 | Smith et al. |
| 6,753,120 B2 | 6/2004 | Kim |
| 6,766,211 B1 | 7/2004 | Ausschnitt |
| 6,803,995 B2 | 10/2004 | Ausschnitt |
| 6,842,237 B2 | 1/2005 | Ausschnitt et al. |
| 6,869,739 B1 | 3/2005 | Ausschnitt et al. |
| 6,879,400 B2 | 4/2005 | Ausschnitt et al. |
| 6,921,916 B2 * | 7/2005 | Adel et al. ...................... 257/48 |
| 6,937,337 B2 | 8/2005 | Ausschnitt et al. |
| 6,952,886 B1 * | 10/2005 | Kim ................................. 33/645 |
| 6,975,398 B2 | 12/2005 | Ausschnitt et al. |
| 6,985,618 B2 | 1/2006 | Adel et al. |
| 7,019,836 B2 | 3/2006 | Mishima |
| 7,042,551 B2 | 5/2006 | Ausschnitt |
| 7,061,615 B1 * | 6/2006 | Lowe-Webb .................. 356/401 |
| 7,068,833 B1 | 6/2006 | Ghinovker et al. |
| 7,126,669 B2 | 10/2006 | Edart |
| 7,180,593 B2 | 2/2007 | Lin |
| 7,242,477 B2 * | 7/2007 | Mieher et al. ................. 356/401 |
| 7,336,352 B2 | 2/2008 | Tanaka |
| 7,346,878 B1 | 3/2008 | Cohen et al. |
| 7,355,291 B2 | 4/2008 | Adel et al. |
| 7,359,054 B2 | 4/2008 | Ausschnitt et al. |
| 7,379,184 B2 | 5/2008 | Smith et al. |
| 7,473,502 B1 | 1/2009 | Ausschnitt et al. |
| 7,474,401 B2 | 1/2009 | Ausschnitt et al. |
| 7,480,892 B2 * | 1/2009 | Chiu .................... G03F 7/70633 716/50 |
| 7,556,898 B2 * | 7/2009 | Marokkey ........... G03F 7/70566 430/22 |
| 7,671,990 B1 | 3/2010 | Adel et al. |
| 8,330,281 B2 | 12/2012 | Ghinovker et al. |
| 8,339,605 B2 | 12/2012 | Ausschnitt et al. |
| 8,513,822 B1 * | 8/2013 | Ghinovker .......... G03F 7/70633 257/48 |
| 2001/0001900 A1 | 5/2001 | Pogge et al. |
| 2001/0055720 A1 | 12/2001 | Sato et al. |
| 2002/0097399 A1 | 7/2002 | Ausschnitt et al. |

(56) References Cited

U.S. PATENT DOCUMENTS

| | | |
|---|---|---|
| 2003/0021465 A1 | 1/2003 | Adel et al. |
| 2003/0021466 A1 | 1/2003 | Adel et al. |
| 2003/0021467 A1 | 1/2003 | Adel et al. |
| 2003/0026471 A1 | 2/2003 | Adel et al. |
| 2003/0053057 A1 | 3/2003 | Mishima |
| 2003/0071997 A1 | 4/2003 | Ausschnitt et al. |
| 2003/0077527 A1 | 4/2003 | Ausschnitt et al. |
| 2003/0102440 A1 | 6/2003 | Sohn |
| 2003/0123052 A1 | 7/2003 | Ausschnitt et al. |
| 2004/0233441 A1 | 11/2004 | Mieher et al. |
| 2005/0012928 A1 | 1/2005 | Sezginer et al. |
| 2005/0105092 A1 | 5/2005 | Ausschnitt et al. |
| 2005/0173634 A1 | 8/2005 | Wong et al. |
| 2006/0033921 A1 | 2/2006 | Den Boef et al. |
| 2006/0039595 A1 | 2/2006 | Adel et al. |
| 2006/0066855 A1 | 3/2006 | Boef et al. |
| 2006/0080046 A1 | 4/2006 | Ziger et al. |
| 2006/0139596 A1 | 6/2006 | Edart |
| 2006/0177120 A1 | 8/2006 | Ghinovker et al. |
| 2006/0204073 A1 | 9/2006 | Ghinovker et al. |
| 2007/0008533 A1 | 1/2007 | Ghinovker |
| 2007/0058169 A1 | 3/2007 | Ausschnitt et al. |
| 2007/0076205 A1 | 4/2007 | Schulz |
| 2007/0229829 A1 | 10/2007 | Kandel et al. |
| 2008/0024744 A1 | 1/2008 | Van Horssen |
| 2008/0034344 A1* | 2/2008 | Chiu .................. G03F 7/70633 430/5 |
| 2008/0121939 A1* | 5/2008 | Murray et al. ................ 257/202 |
| 2009/0186286 A1 | 7/2009 | Ausschnitt et al. |
| 2009/0224413 A1 | 9/2009 | Ghinovker |
| 2009/0244538 A1 | 10/2009 | Den Boef et al. |
| 2010/0155968 A1 | 6/2010 | Ghinovker et al. |
| 2010/0190096 A1* | 7/2010 | Ausschnitt ................ G03F 1/14 430/5 |

FOREIGN PATENT DOCUMENTS

| | | |
|---|---|---|
| EP | 0947828 A2 | 3/1999 |
| JP | 61-168227 A | 7/1986 |
| JP | 61-170032 A | 7/1986 |
| JP | 01214117 A | 8/1989 |
| JP | 2-260441 A | 10/1990 |
| JP | 05127364 A | 5/1993 |
| JP | 10-213895 | 8/1998 |
| JP | 11067631 | 3/1999 |
| JP | 11095407 | 4/1999 |
| JP | 2000-294487 A | 10/2000 |
| JP | 2009-500863 A | 1/2009 |
| JP | 2009-514230 A | 4/2009 |
| KR | 10-2008-0035345 A | 4/2008 |
| WO | 002/19415 A1 | 3/2002 |

OTHER PUBLICATIONS

U.S. Appl. No. 10/367,124, filed Feb. 13, 2003; Office Action dated Oct. 4, 2007.

Adel, et al., "Overlay Metrology and Control Method", U.S. Appl. No. 10/367,124, filed Feb. 13, 2003.

Claims from U.S. Appl. No. 10/950,172, filed Sep. 23, 2004.

Ghinovker, et al., "OVerlay Marks, Methods of Overlay Mark Design and Methods of Overlay Measurements", U.S. Appl. No. 09/894,987, filed Jun. 27, 2001.

U.S. Office Action dated Oct. 10, 2006, U.S. Appl. No. 10/950,172.

Bishop, et al., "The OMAG3 Reticle Set", Jul. 31, 2003, International SEMATECH, Technology Transfer #3074417A-ENG, pp. 1-26.

International Search Report from PCT application No. PCT/US03/04471, dated May 22, 2003 (5 pgs).

Raugh, Michael R., "Self-calibration of Interferometer Stages: Mathematical Techniques for Deriving Lattice Algorithms for Nanotechnology"; Mar. 2002 (rev. Aug. 2003), 66 pages.

Binns, L.A. et al., Nanometrics; Ausschnitt, C.P., et al. IBM SDRC; "Overlay Metrology Tool Calibration", Proc. SPIE 6518 (2007), 9 pages.

Nelson M. Felix et al., Smaller, smarter, faster and more accurate: The new overlay metrology, Metrology, Inspection, and Process Control for Microlithography XXIV, edited by Christopher J. Raymond, Proc. of SPIE vol. 7638, 76380Y, © 2010 SPIE.

Office Action for KR 10-2014-7028219 dated Jan. 8, 2016. 18 pages.

\* cited by examiner

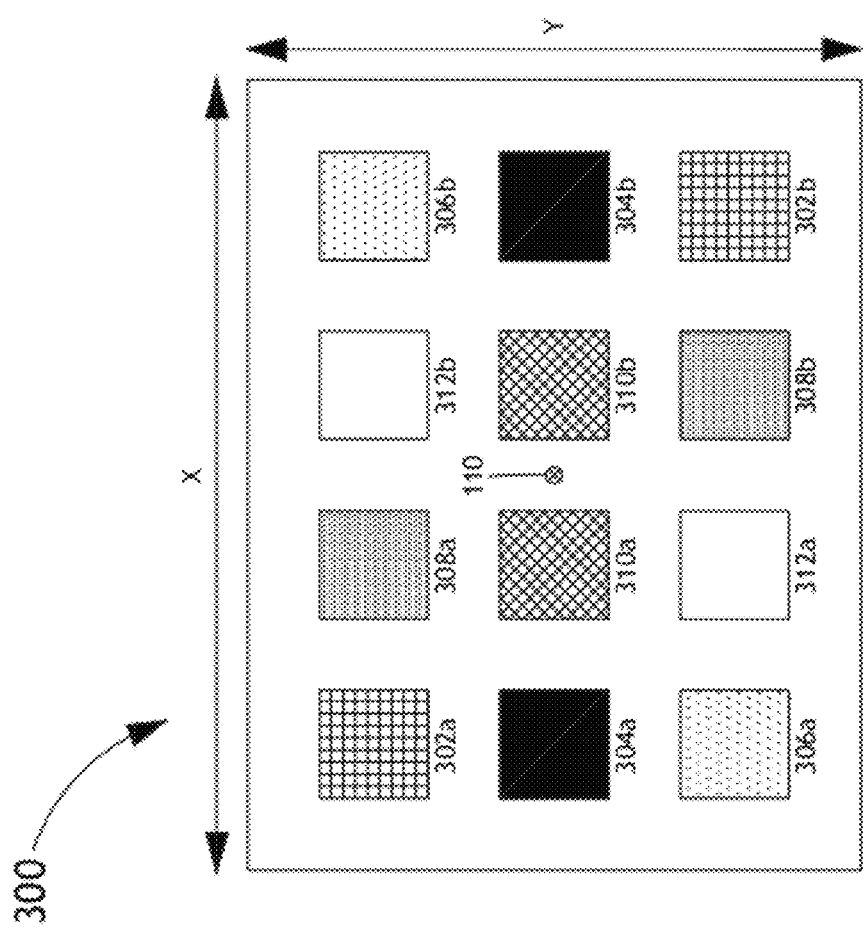

MULTI-LAYER OVERLAY METROLOGY TARGET AND COMPLIMENTARY OVERLAY METROLOGY MEASUREMENT SYSTEMS

CROSS-REFERENCE TO RELATED APPLICATION

The present application is related to and claims the benefit of the earliest available effective filing date(s) from the following listed application(s) (the "Related Applications") (e.g., claims earliest available priority dates for other than provisional patent applications or claims benefits under 35 USC § 119(e) for provisional patent applications, for any and all parent, grandparent, great-grandparent, etc. applications of the Related Application(s)).

RELATED APPLICATIONS

For purposes of the USPTO extra-statutory requirements, the present application constitutes a regular (non-provisional) patent application of United States Provisional patent application entitled MULTI-LAYER OVERLAY METROLOGY, naming Daniel Kandel, Vladimir Levinski, and Guy Cohen as inventors, filed Aug. 3, 2010, Application Ser. No. 61/370,341.

TECHNICAL FIELD

The present invention generally relates to an overlay target used for overlay metrology, and more particularly to a multi-layer target and complimentary metrology systems.

BACKGROUND

In a variety of manufacturing and production settings, there is a need to control alignment between various layers or within particular layers of a given sample. For example, in the context of semiconductor processing, semiconductor-based devices may be produced by fabricating a series of layers on a substrate, some or all of the layers including various structures. The relative position of these structures both within a single layer and with respect to structures in other layers is critical to the performance of the devices. The misalignment between various structures is known as overlay error.

The measurement of overlay error between successive patterned layers on a wafer is one of the most critical process control techniques used in the manufacturing of integrated circuits and devices. Overlay accuracy generally pertains to the determination of how accurately a first patterned layer aligns with respect to a second patterned layer disposed above or below it and to the determination of how accurately a first pattern aligns with respect to a second pattern disposed on the same layer. Presently, overlay measurements are performed via test patterns that are printed together with layers of the wafer. The images of these test patterns are captured via an imaging tool and an analysis algorithm is used to calculate the relative displacement of the patterns from the captured images. Such overlay metrology targets (or 'marks') generally comprise features formed in two layers, the features configured to enable measurement of spatial displacement between features of the layers (i.e., the overlay or displacement between layers). FIGS. 1A through 2B illustrate typical overlay targets of the prior art. FIGS. 1A and 1B illustrate overlay targets having 180 degree and 90 degree rotational symmetry, respectively, about a center of symmetry. Moreover, the target structures of FIGS. 1A and 1B include pattern elements (e.g., 102a through 108b), which are individually invariant to 90 degree rotation. Due to the 90 degree invariance of the individual pattern elements the pattern elements of targets 100 and 101 of FIGS. 1A and 1B are suitable for both X-overlay and Y-overlay measurements.

FIGS. 2A and 2B illustrate targets 200 and 201 which display invariance to a 90 degree and 180 degree rotation, respectively. In contrast to FIGS. 1A and 1B, the pattern elements (e.g., 202a through 208d) display only 180 degree rotational symmetry. As such, at least two separate orthogonally oriented pattern elements must be used in order to measure overlay in both the X- and Y-direction. For instance, the pattern elements 202a, 204a, 202d, and 204d may be used to measure overlay in a first direction, while elements 202b, 204b, 204c, and 202c may be used to measure overlay in a second direction orthogonal to the first direction.

Although existing targets and target measurement systems are suitable for many implementation contexts, it is contemplated herein that many improvements may be made. The invention described herein discloses targets and apparatus for enabling improved metrology measurements

SUMMARY

A multi-layer overlay target for use in imaging based metrology is disclosed. In one aspect, the multidirectional overlay mark may include, but is not limited to, a plurality of target structures including three or more target structures, each target structure including a set of two or more pattern elements, wherein the target structures are configured to share a common center of symmetry upon alignment of the target structures, each target structure being invariant to N degree rotation about the common center of symmetry, wherein N is equal to or greater than 180 degrees, wherein each of the two or more pattern elements has an individual center of symmetry, wherein each of the two or more pattern elements of each target structure is invariant to M degree rotation about the individual center of symmetry, wherein M is equal to or greater than 180 degrees.

In another aspect, multi-layer overlay target for use in imaging based metrology may include, but is not limited to, a plurality of target structures including three or more target structures, wherein each target structure includes a set of two or more pattern elements, wherein the target structures are configured to share a common center of symmetry upon alignment of the target structures, wherein each target structure is invariant to a 90 degree rotation about the common center of symmetry, wherein each of the two or more pattern elements has an individual center of symmetry, wherein each of the two or more pattern elements of each target structure is invariant to M degree rotation about the individual center of symmetry, wherein M is equal to or greater than 180 degrees.

An apparatus suitable for contrast enhancement of a multi-layer overlay metrology target is disclosed. In one aspect, the apparatus may include, but is not limited to, an illumination source; a first polarizer configured to polarize at least a portion of light emanating from the illumination source; a beam splitter configured to direct a first portion of light processed by the first polarizer along an object path to a surface of one or more specimens and a second portion of light processed by the first polarizer along a reference path; a detector disposed along a primary optical axis, wherein the detector is configured to collect a portion of light reflected from the surface of the one or more specimens; and a second polarizer configured to analyze at least a portion of light reflected from the surface of the one or more specimens prior to the light impinging on the image plane of the detector, wherein the first polarizer and the second polarizer are arranged to minimize the amount of light reflected from unpattern portions of the one or more specimens reaching the detector.

In another aspect, the apparatus may include, but is not limited to, an illumination source; a detector disposed along a primary optical axis, wherein the detector is configured to collect a portion of light reflected from a surface of the one or more specimens; an aperture positioned at a pupil plane of an illumination path, wherein the aperture is configured to select an illumination angle of illumination emanating from the illumination source, wherein the illumination angle is suitable for achieving a selected contrast level at an imaging plane of the detector; and a first beam splitter configured to direct a first portion of light transmitted through the aperture along an object path to a surface of one or more specimens and a second portion of light transmitted through the aperture along a reference path.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the disclosure may be better understood by those skilled in the art by reference to the accompanying figures in which:

FIG. 3 is a top plan view of a multi-layer overlay target, in accordance with one embodiment of the present invention.

DETAILED DESCRIPTION OF THE INVENTION

Reference will now be made in detail to the subject matter disclosed, which is illustrated in the accompanying drawings.

Referring generally to FIGS. 3 through 10, an overlay target suitable for imaging based overlay metrology is described in accordance with the present disclosure. In a general sense, the overlay targets of the present invention may be used to determine overlay error between two successive process layers of a semiconductor wafer. For example, an overlay target may be utilized to measure the alignment of a first semiconductor layer with respect to a second semiconductor layer, where the second layer and the first layer are disposed successively. Additionally, an overlay target may be used to determine alignment error between two structures formed on a common semiconductor layer via two or more different processes (e.g., lithographic exposures). For example, an overlay target may be utilized to measure the alignment of a first pattern with respect to a second pattern, where the first pattern and the second pattern are successive patterns formed on the same semiconductor layer.

For instance, in a measurement utilizing two or more overlay targets, an overlay target may be printed at a specific location on a first wafer layer and a second wafer layer, so that when the first and second layers are properly aligned the pattern elements of the first structure and second structure of the overlay target also align. When the first and second layers are 'mis-registered,' however, a relative shift between the pattern elements of the first structure 102 and the second structure 104 of a given thin overlay mark 100 exists, a shift that can be measured through a variety of techniques.

The structures and pattern elements described herein may be fabricated using any process known in the art suitable for semiconductor wafer processing, such as, but not limited to, photolithographic, etching, and deposition techniques. Methods for printing overlay targets and their contained structures, pattern elements, and pattern sub-elements are described generally in U.S. application Ser. No. 11/179,819 filed on Feb. 23, 2006, and is incorporated herein by reference.

Figure 1B:
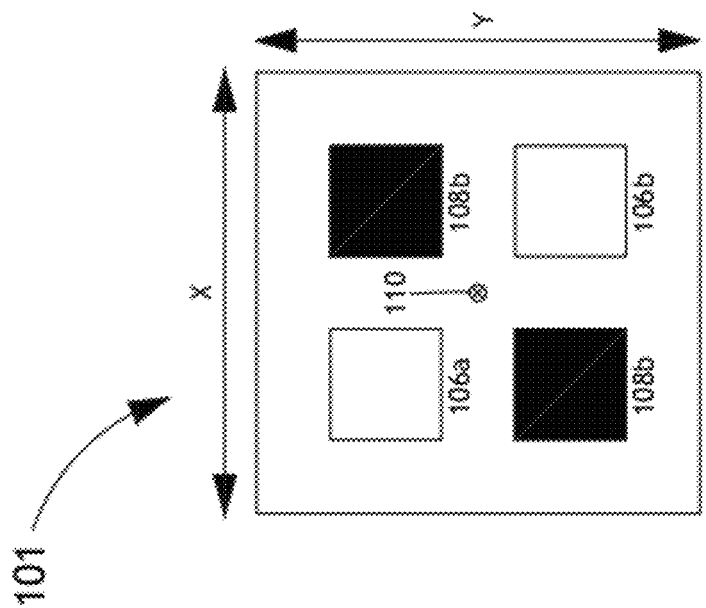
FIG. 1B is a top plan view of an overlay target.
Figure 1A:
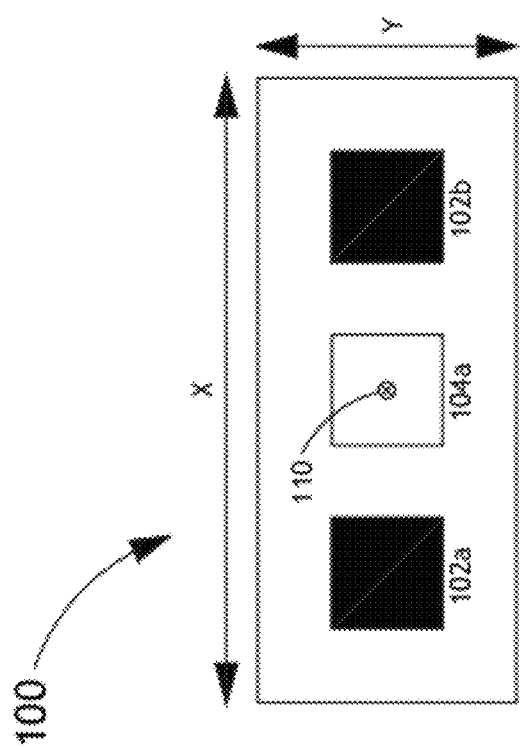
FIG. 1A is a top plan view of an overlay target.
Figure 2B:
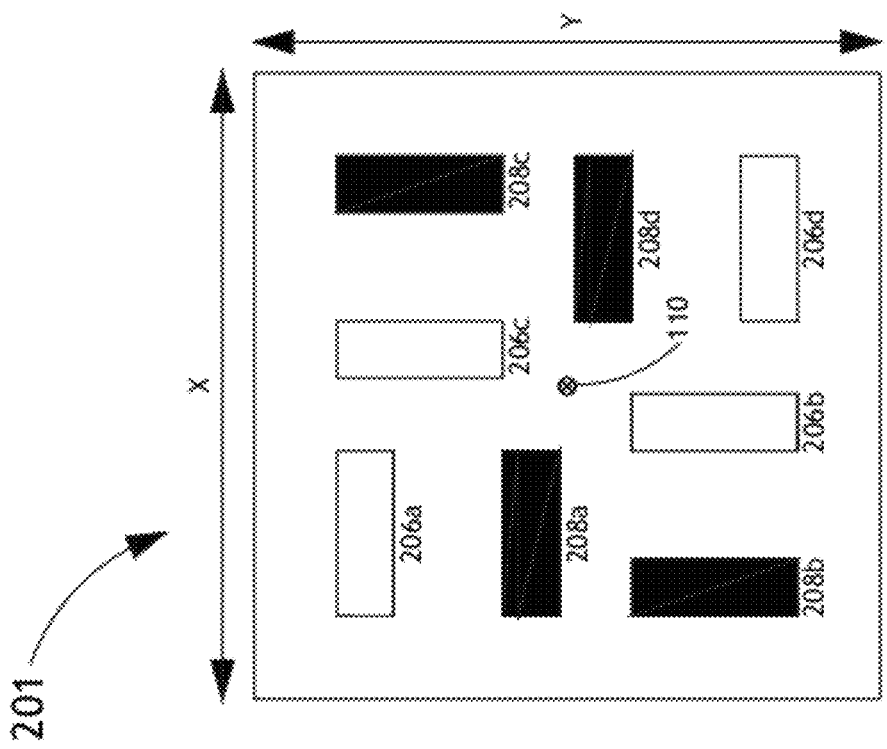
FIG. 2B is a top plan view of an overlay target.
Figure 2A:
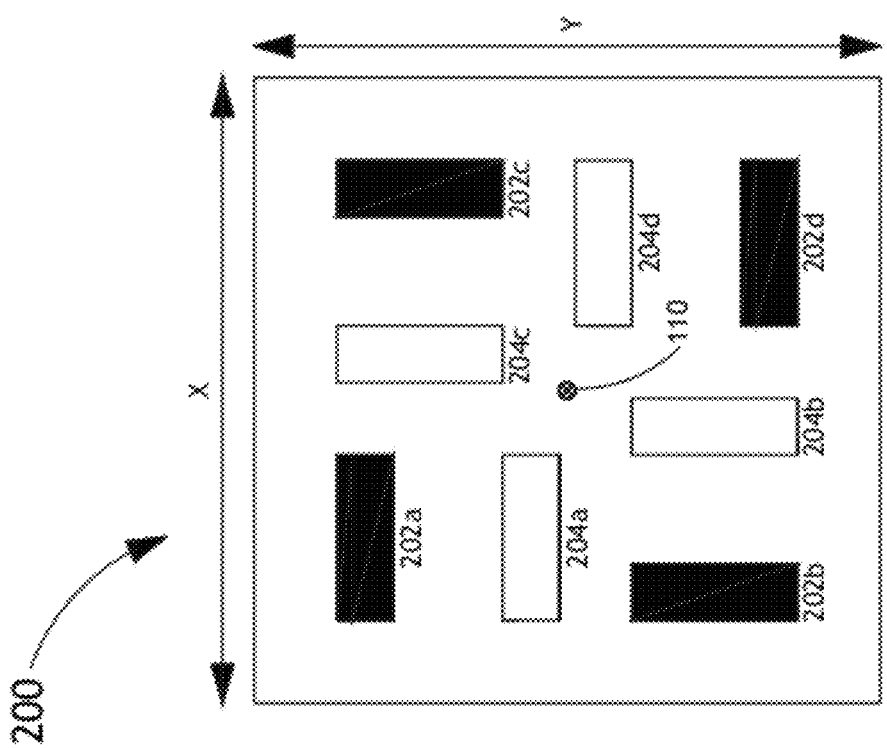
FIG. 2A is a top plan view of an overlay target.

FIG. 3 illustrates a top plan view of a six-layer overlay target 300 suitable for imaging based metrology, in accordance with an exemplary embodiment of the present invention. In one aspect, the overlay target 300 may include three or more target structures. In another aspect of target 300, each of the target structures of the overlay target 300 includes two or more pattern elements. Note that for the purposes of this disclosure texture patterns in FIG. 2 (and figures throughout this disclosure) are used to represent the different target structures of a target, wherein pattern elements belonging to the same target structure have the same texture. The texture patterns displayed in the various figures of the present disclosure should not be interpreted as limiting as the selected texture pattern is not representative of a structural aspect of the associated pattern element, but is merely utilized to represent pattern elements of the same target structure. By way of example, as shown in FIG. 3, the target 300 may include six target structures (each structure illustrated with a unique texture). Further, each of the six target structures of target 300 may include two pattern elements. For instance, as shown in FIG. 3, a first structure may include pattern elements 302a and 302b, a second structure may contain pattern elements 304a and 304b, a third structure may include pattern elements 306a and 306b, a fourth structure may include pattern elements 308a and 308b, a fifth structure may include pattern elements 310a and 310b, and a sixth structure may include pattern elements 312a and 312b. More generally, a given structure of target 300 (i.e., first, second, third, or up to an Nth structure) may contain from two pattern elements up to and including an Nth pattern element.

In another aspect of target 300 of the present invention, each of the target structures of target 300 are designed such that each is invariant to a 180 degree rotation about a common center of symmetry 110. For example, as shown in FIG. 3, upon rotating the target structures about the common center of symmetry 110 by 180 degrees the top view image of the structures remains identical to the top view image of the structures prior to rotation. Resultantly, it will be recognized by those skilled in the art that the overall target, consisting of the multiple individual structures, is invariant to a 180 degree rotation about the common center of symmetry 110 when properly aligned. In one embodiment, as illustrated in FIG. 3, the two pattern elements of each structure may be oriented at positions diagonally opposed to one another, resulting in 180 degree rotational symmetry for the overlay target as a whole.

It is recognized herein that the utilization of an overlay target 300 invariant to a 180 degree rotation about the common center of symmetry 110 allows for the use of the target 300 in overlay metrology between more than two layers. In this manner, overlay metrology measurements may be performed utilizing any pair of the six target structures present in overlay target 300. Moreover, due to the collocation of the center of symmetries of each structure of target 300, overlay metrology measurements may be acquired from all six structures in a single image grab.

It should be recognized that while a first structure and a second structure share a common center of symmetry by design when a first layer and a second layer are properly aligned, upon misalignment between a first layer and a second layer, the first structure and the second structure shift with respect to one another. As a result of misalignment, the center of symmetry of a first structure and the center of symmetry of a second structure will shift and the center of symmetries of the first structure and the second structure will no longer coincide. It is recognized that this concept may be extended to all of the structures within a given target of the present invention. It is the measurement of this shift between centers of symmetries of various structures of a target 300 which enables the overlay measurement. Measurement techniques that may be used in the context of the target 300 described herein are described in U.S. application Ser. No. 11/830,782 filed on Jul. 30, 2007, and Ser. No. 11/179,819 filed on Jul. 11, 2005, and are incorporated herein by reference.

In another aspect, each pattern element of each structure of the target 300 possesses an individual center of symmetry 110. Moreover, the pattern elements of target 300 are designed such that each pattern element (e.g., 302a-302b, 304a-304b and etc.) are invariant to a 90° rotation about the center of symmetry 110 of the individual pattern element. As a result of the 4-fold rotational symmetry of each of the pattern elements of each of the structures of the target 300, X-overlay and Y-overlay measurements may be performed utilizing the same pattern element.

It should be recognized by those skilled in the art that the number of target structures and the number of pattern elements within the target structures as depicted in FIG. 3 do not represent limitations, but rather should be interpreted as illustrative in nature.

Moreover, it will be recognized by those skilled in the art that the use of a rectangular target region, as depicted in FIG. 3, is not a limitation and that generally a variety of mark region shapes (e.g., square, trapezoid, parallelogram, or ellipse) may be used to characterize the perimeter of an overlay target boundary. For example, a set of structures of a given target may be arranged such that their outermost edges form an ellipsoidal or circular shaped target region.

Generally, the two dimensional shapes of the various pattern elements of the first structure and the second structure are not limited. As such the square shape of the pattern elements, as depicted in FIG. 3, should not be interpreted as a limitation but merely an illustration. It is recognized that a variety of pattern element shapes exist that may produce the 90 degree rotational invariance as required of the pattern elements (e.g., 302a through 312b) of target structure 300. For instance, the pattern elements of target structure 300 may include pattern elements having a square shape, a cross shape, or a diamond shape, among others.

In another aspect, as illustrated in FIG. 3, the pattern elements of the first structure may be identical to the pattern elements of the second structure. For example, all of the pattern elements of target structure 300 may have a square shape.

In another aspect, the pattern elements of the various structures of the target structure 300 may be different. For example, although not shown, the pattern elements 302a and 302b of the first structure may be different from the pattern elements 304a and 304b of the second structure. For instance, the pattern elements 302a and 302b of the first structure may have a square shape, while the pattern elements 304a and 304b of the second structure may have a 'cross' shape (not shown).

In another aspect, the shapes of the pattern elements within a single target structure (i.e., the first structure or the second structure) may be uniform. More specifically, the pattern elements within a given structure may have an identical shape. For example, the pattern elements 306a and 306b of the third target structure may both have a square shape.

In another aspect, the shapes of the pattern elements within a given structure (i.e., the first structure or the second structure) may be non-uniform (not shown). More specifically, a given structure may contain more than one pattern element shape. For example, the fourth structure may include pattern element 308a having a 'cross' shape (not shown) and a pattern element 308b having a square shape. It should be recognized that there is no generalized limitation on the shape of the pattern elements of the target structures of overlay target 300, provided the shapes of the pattern elements and the orientation of the pattern elements results in the target structures having 180 degree rotational invariance about their common center of symmetry and each pattern element of each target structure having 90 degree rotational invariance about its individual center of symmetry.

The pattern elements of the structures of overlay target 300 may be arranged according to various sets of spatial positions. For example, the pattern elements 302a and 302b of the first structure, the pattern elements 304a and 304b of the second structure, the pattern elements 306a and 306b of the third structure, the pattern elements 308a and 308b of the fourth structure, the pattern elements 310a and 310b of the fifth structure, and the pattern elements 312a and 312b of the sixth structure may be arranged such that they form a periodic or non-periodic pattern. For instance, as shown in FIG. 3, the two-dimensional arrangement of the pattern elements 302a through 312b forms a two-dimensional periodic array. It is contemplated herein that a variety of arrangements may be suitable for creating the 180 degree rotational invariance of the target 300.

Figure 4:
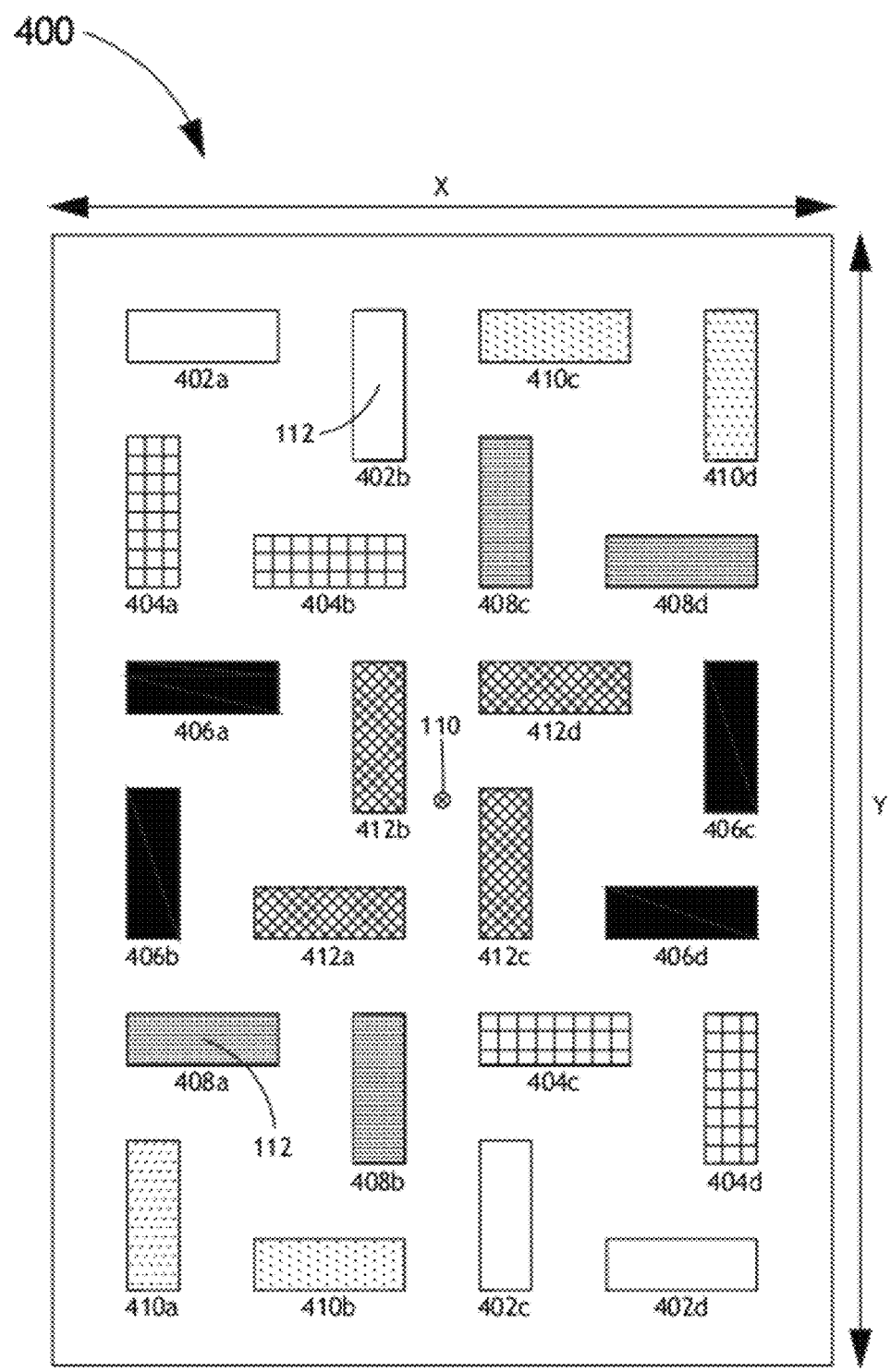
FIG. 4 is a top plan view of a multi-layer overlay target, in accordance with one embodiment of the present invention.
Figure 5:
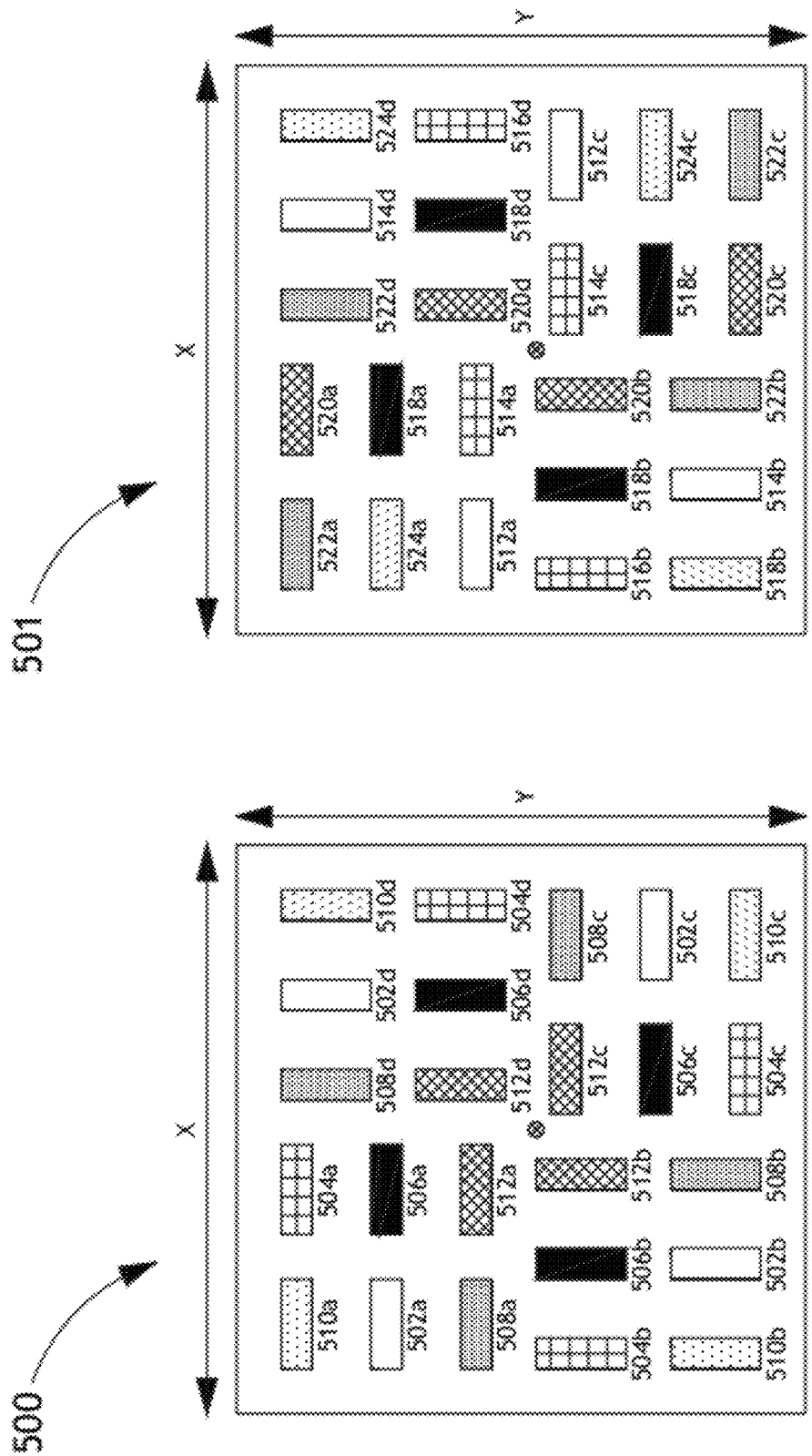
FIG. 5A is a top plan view of a multi-layer overlay target, in accordance with one embodiment of the present invention.
FIG. 5B is a top plan view of a multi-layer overlay target, in accordance with one embodiment of the present invention.

FIG. 4 illustrates a top plan view of an overlay target 400, in accordance with an alternate embodiment of the present invention. Applicant notes that unless otherwise noted the descriptive material provided above with respect to target 300 should be interpreted to apply to the remainder of the instant disclosure.

As in the target 300 described previously herein, the multilayer overlay target 400 may include three or more target structures, with each target structure including two or more pattern elements. For example, the overlay target 400 may include six target structures, with each target structure containing four pattern elements. For example, as shown in FIG. 4, a first structure may include pattern elements 402a, 402b, 402c and 402d, a second structure may contain pattern elements 404a, 404b, 404c, and 404d, a third structure may contain pattern elements 406a, 406b, 406c, and 406d, and so on. As in target 300, generally speaking, a given structure of target 400 (i.e., first, second, third, or up to an Nth structure) may contain from two pattern elements up to and including an Nth pattern element.

In another aspect of target 400, similar to the above described target 300, each of the target structures of target 400 are designed such that each is invariant to a 180 degree rotation about a common center of symmetry 110, resulting target 400 also being invariant to a 180 degree rotation. For example, as shown in FIG. 4, the pattern elements 402a and 402b of the first structure of target 400 are oriented diagonally from the pattern elements 402c and 402d and arranged such that the first target structure is invariant to 180 degree rotation about its center of symmetry 110. It is noted, however, that the target structures of target 400 are not invariant to a 90 degree rotation Similar to target 300 above, target 400 may also be utilized in overlay metrology between more than two layers. Resultantly, overlay metrology measurements may be performed utilizing any pair of the six target structures present in overlay target 400. Moreover, due to the collocation of the center of symmetries 110 of each structure of target 400, overlay metrology measurements may be acquired from all six structures in a single image grab.

In a further aspect of the present invention, for each target structure, the center of symmetry 110 for the set of pattern elements utilized for X-overlay measurements (e.g., 402a and 402d) is collocated with the set of pattern elements utilized for Y-overlay measurements (e.g., 402b and 402c).

It is recognized that a design such as this allows for the simultaneous acquisition of X-overlay and Y-overlay data in a single "image grab." As such, the move-acquire-measurement time as compared to traditional overlay targets is greatly reduced. Moreover, it is further recognized that the design depicted in FIG. 4 may allow for compatibility with presently existing metrology tool procedures and architectures.

In another aspect, the individual pattern elements of target 400 are designed such that each pattern element (e.g., 402a-402b, 404a-404b and etc.) is invariant to a 180° rotation about the center of symmetry 112 of the individual pattern element. In contrast to target 300, it is further noted that the individual pattern elements of target 400 are not invariant to a 90° rotation about the center of symmetry 112 of the individual pattern element. As such, a single pattern element (e.g., 402a) cannot be utilized to measure both X-overlay and Y-overlay. Thus, each individual pattern element may be utilized to measure either X-overlay or Y-overlay. For example, the target structures of target 400 include pairs of pattern elements, one designated for X-overlay and one designated for Y-overlay. The shapes of the pattern elements depicted in FIG. 4 do not represent a limitation as it should be recognized that there exist a number of other pattern elements shapes having 180 degree rotational symmetry (but not 90 degree rotational symmetry) which are suitable for implementation in the present invention.

In a general sense, any pattern element and target structure scheme which produces 180 degree rotational symmetry (without producing 90 degree rotational symmetry) for the target structures about the common center of symmetry 110, while producing 180 degree rotational symmetry (without producing 90 degree rotational symmetry) for the individual pattern elements (e.g., 402a through 412d) about each pattern element center of symmetry 112, may be suitable for implementation in the present invention. For this reason, the target structure and pattern element scheme depicted in FIG. 4 should be interpreted merely as illustrative and should not be considered limiting.

FIG. 5A illustrates a top plan view of an overlay target 500, in accordance with an alternate embodiment of the present invention. As the previously described overlay targets, the multilayer target 500 may include three or more target structures, with each target structure including two or more pattern elements. For example, as shown in FIG. 5A, the overlay target 500 may include six target structures, with each target structure containing four pattern elements. For example, as shown in FIG. 5A, a first structure may include pattern elements 502a, 502b, 502c and 502d, a second structure may contain pattern elements 504a, 504b, 504c, and 504d, and so on. Again, generally speaking, a given structure of target 500 (i.e., first, second, third, or up to an Nth structure) may contain from two pattern elements up to and including an Nth pattern element.

In contrast to targets 300 and 400, each of the target structures of target 500 are designed such that each is invariant to a 90 degree rotation about a common center of symmetry 110, resulting in target 500 also being invariant to a 90 degree rotation. For example, as shown in FIG. 5A, the pattern elements 512a, 512b, 512c, and 512d of the sixth target structure of target 500 are arranged such that the sixth target structure is invariant to 90 degree rotation about its center of symmetry 110.

In another aspect, the individual pattern elements of target 500 are designed such that each pattern element (e.g., 502a-502d, 504a-504d and etc.) is invariant to a 180° rotation about the center of symmetry of the individual pattern element 112. Again, the pattern elements of 500 are not invariant to a 90° rotation about the center of symmetry of the individual pattern element 112. Therefore, as in target 400, a single pattern element (e.g., 502a) cannot be utilized to measure both X-overlay and Y-overlay. As such, each individual pattern element may be utilized to measure either X-overlay or Y-overlay. For example, the target structures of target 500 include two pairs of pattern elements, one pair (502a and 502c) designated for X-overlay measurement and one pair (502b and 502d) designated for Y-overlay measurement. Also as in target 400, the shapes of the pattern elements depicted in FIG. 5 do not represent a limitation as it should be recognized that there exist a number of other pattern elements shapes having 180 degree rotational symmetry (without producing 90 degree rotational symmetry) about an individual center of symmetry 112 of the pattern element which are suitable for implementation in the present invention.

In a general sense, any pattern element and target structure scheme which produces 90 degree rotational symmetry for the target structures about the common center of symmetry 110, while producing 180 degree rotational symmetry (without producing 90 degree rotational symmetry) for the individual pattern elements (e.g., 502a through 512d) about each pattern element center of symmetry 112, may be suitable for implementation in the present invention. For this reason, the target structure and pattern element scheme depicted in FIG. 5 should be interpreted merely as illustrative and should not be considered limiting.

FIG. 5B illustrates a top plan view of an overlay target 501, in accordance with an alternate embodiment of the present invention. As the previously described overlay targets, the multilayer target 501 may include three or more target structures, with each target structure including two or more pattern elements. For example, as shown in FIG. 5B, the overlay target 501 may include six target structures, with each target structure containing four pattern elements. For example, as shown in FIG. 5B, a first structure may include pattern elements 514a, 514b, 514c and 514d, a second structure may contain pattern elements 516a, 516b, 516c, and 516d, a third structure may contain pattern elements 518a, 518b, 518c, and 518d, and so on. Again, generally speaking, a given structure of target 501 (i.e., first, second, third, or up to an Nth structure) may contain from two pattern elements up to and including an Nth pattern element.

In contrast to FIG. 5A, the overlay target 501 is designed to be invariant to 180 degrees, but not invariant to 90 degrees. In this manner, each of the target structures of target 501 are designed such that each is at least invariant to 180 degree rotation about a common center of symmetry 110, resulting in target 501 also being invariant to a 180 degree rotation. For example, as shown in FIG. 5B, the pattern elements 524a, 524b, 524c, and 524d of the sixth target structure of target 501 are arranged such that the sixth target structure is invariant to 180 degree rotation (but not 90 degree rotation) about its center of symmetry 110. Applicant notes that each constituent target structure of overlay target 501 need not be limited to 180 degree rotational symmetry. For instance, as shown in FIG. 5B, it is noted that the arrangement of pattern elements 518a, 518b, 518c, and 518d form a 90 degree rotationally invariant target structure. As depicted in FIG. 5B, however, the combination of the six target structures form an overlay target 501 which lacks 90 degree rotational symmetry but possesses 180 degree rotational symmetry since the remaining target structures lack 90 degree rotational symmetry.

In a general sense, any pattern element and target structure scheme which produces 180 degree rotational symmetry for the target structures about the common center of symmetry 110, while producing 180 degree rotational symmetry for the individual pattern elements (e.g., 514a through 524d) about each pattern element center of symmetry 112, may be suitable for implementation in the present invention. For this reason, the target structure and pattern element scheme depicted in FIG. 5B should be interpreted merely as illustrative and should not be considered limiting.

Figure 6:
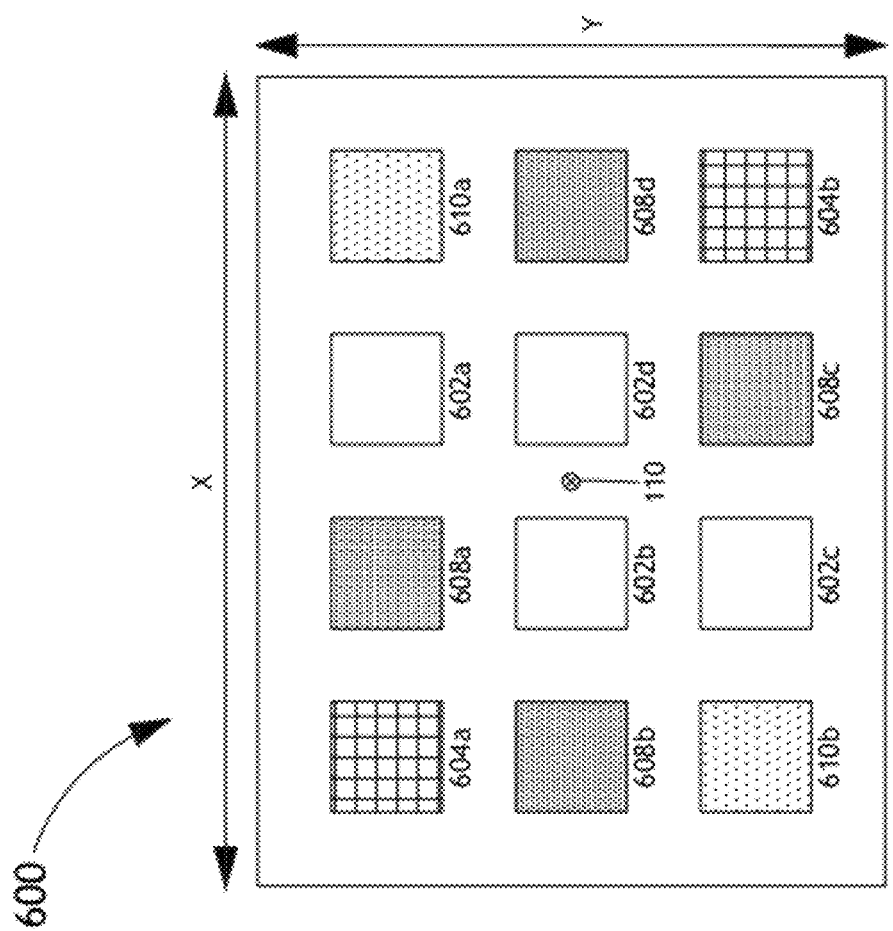
FIG. 6 is a top plan view of a multi-layer overlay target, in accordance with one embodiment of the present invention.

FIG. 6 illustrates a top plan view of overlay target 600, in accordance with alternate embodiment of the present invention. It is recognized that one or more target structures of the various embodiments of the overlay targets described previously herein may lack sufficient contrast suitable for implementation in an overlay metrology measurement process. It is contemplated herein that one or more target structures of a given overlay target 600 may be enhanced by increasing the overall target structure surface area, thereby increasing the information content of the enhanced target structure. For example, the number of pattern elements included in a given target structure may be determined by the level of contrast of the given target structure. For instance, as shown in FIG. 6, the first structure of target 600 may have lower contrast levels than desirable. As such, the designer of the target may enhance the contrast by including additional pattern elements to the target structure. In this manner, the first target structure of target 600 includes four overall pattern elements 602a, 602b, 602c, and 602d, as opposed to the only two pattern elements in the remaining targets structures of the target 600.

It is also recognized that the additional pattern elements utilized to increase contrast of a given target structure should be designed to adhere to the overall set of design rules for the given target. As such, the additional pattern elements should adhere to the symmetry requirements placed on the overall target structure and individual pattern elements in a manner consistent with the above described targets 300, 400, 500, and 501.

For example, as illustrated in FIG. 6, the pattern elements 602a, 602b, 602c, and 602d maintain 180 degree rotational symmetry about the center of symmetry 110 of the overall target 600. Resultantly, the target 600 will maintain 180 degree rotational symmetry about the center of symmetry 110 in a manner similar to targets 300, 400, and 501 described previously herein. Furthermore, also as illustrated in FIG. 6, the pattern elements 602a, 602b, 602c, and 602d maintain 90 degree rotational symmetry about the center of symmetry of the individual pattern elements in a manner consistent with target 200 described previously herein.

Figure 7:
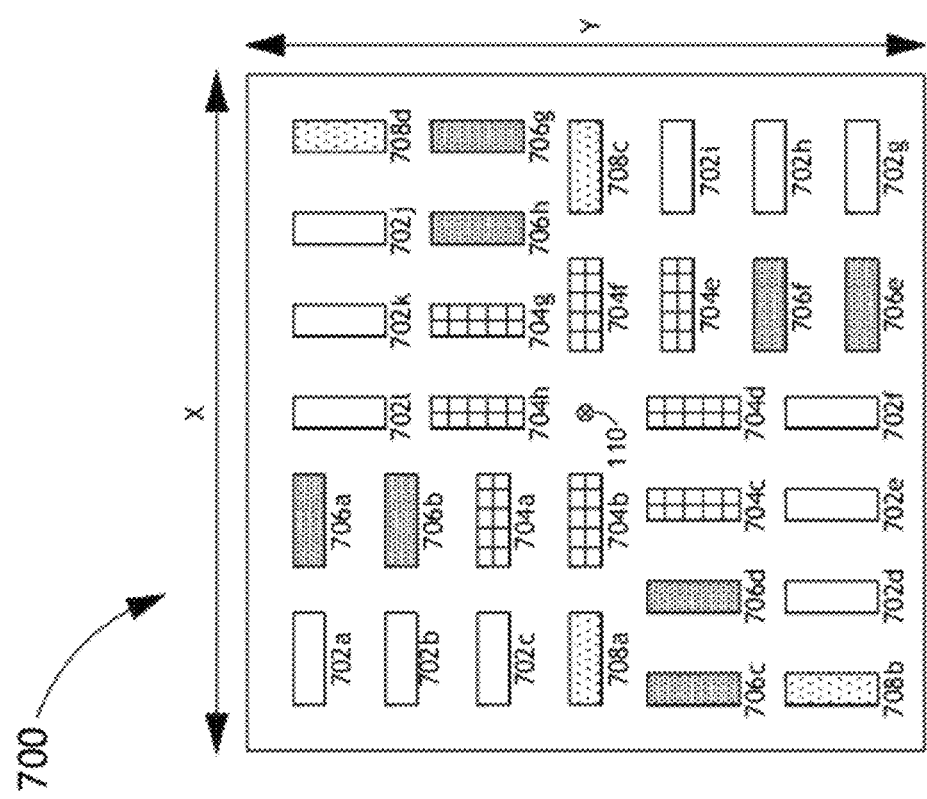
FIG. 7 is a top plan view of a multi-layer overlay target, in accordance with one embodiment of the present invention.

FIG. 7 illustrates a top plan view of overlay target 700, in accordance with an alternate embodiment of the present invention. It is contemplated herein that each target structure of target 700 may include the number of pattern elements necessary to achieve adequate levels of information content (i.e., contrast). In this manner, the information content of one or more target structures may be satisfied by increasing the overall target structure area of target structures lacking in contrast. For example, as shown in FIG. 7, the first structure, second structure, third structure and fourth structure of target 700 may have varying degrees of information deficiencies. As such, the designer may tailor the number of pattern elements of each target structure to make up for this deficiency. For example, the first structure, having the lowest level of contrast, may include twelve pattern elements 702a, 702b, 702c, 702d, 702e, 702f, 702g, 702h, 702i, 702j, 702k, and 702l. Likewise, the second and third structures may have a similar level of contrast needs, each including eight overall pattern elements. The second structure includes 704a, 704b, 704c, 704d, 704e, 704f, 704g, and 704h, while the third structure includes 706a, 706b, 706c, and 706d. In contrast, the fourth target structure of target 700 may require little contrast enhancement or may have surplus information content. In this manner, surface area normally designated for the fourth surface structure may be reallocated to one of the other target structures in order to build up contrast in those lacking target structures while maintaining the overall surface area requirements for the overlay target 700. For example, the fourth target structure may include only 4 target pattern elements 708a, 708b, 708c, and 708d.

It is also recognized that the additional pattern elements utilized to increase contrast of the target structures of overlay target 700 should be designed to adhere to the overall set of design rules for the given target. As such, the additional pattern elements should adhere to the symmetry requirements placed on the overall target structure and individual pattern elements in a manner consistent with the above described targets 400, 500, and 501.

For example, as illustrated in FIG. 7, the pattern elements 704a . . . 704h of the second target structure maintain 90 degree rotational symmetry about the center of symmetry 110 of the overall target 700, while pattern elements 708a . . . 708d of the fourth target structure possess 180 degree rotational symmetry about the center of symmetry 110. Resultantly, the target 700 will maintain at least 180 degree rotational symmetry about the center of symmetry 110 in a manner similar to targets 400 and 501 described previously herein. It is further recognized that the above described utilization of additional pattern elements may also be implemented such that the overlay target possesses 90 degree rotational symmetry similar to target 500 illustrated in FIG. 5A.

Furthermore, also as illustrated in FIG. 7, the individual pattern elements 702a . . . 702l, 704a . . . 704h, 706a . . . 706h, and 708a . . . 708d each are 180 degree rotationally symmetric about the center of symmetry of each individual pattern element in a manner consistent with target 400, 500, and 501 described previously herein.

Figure 8:
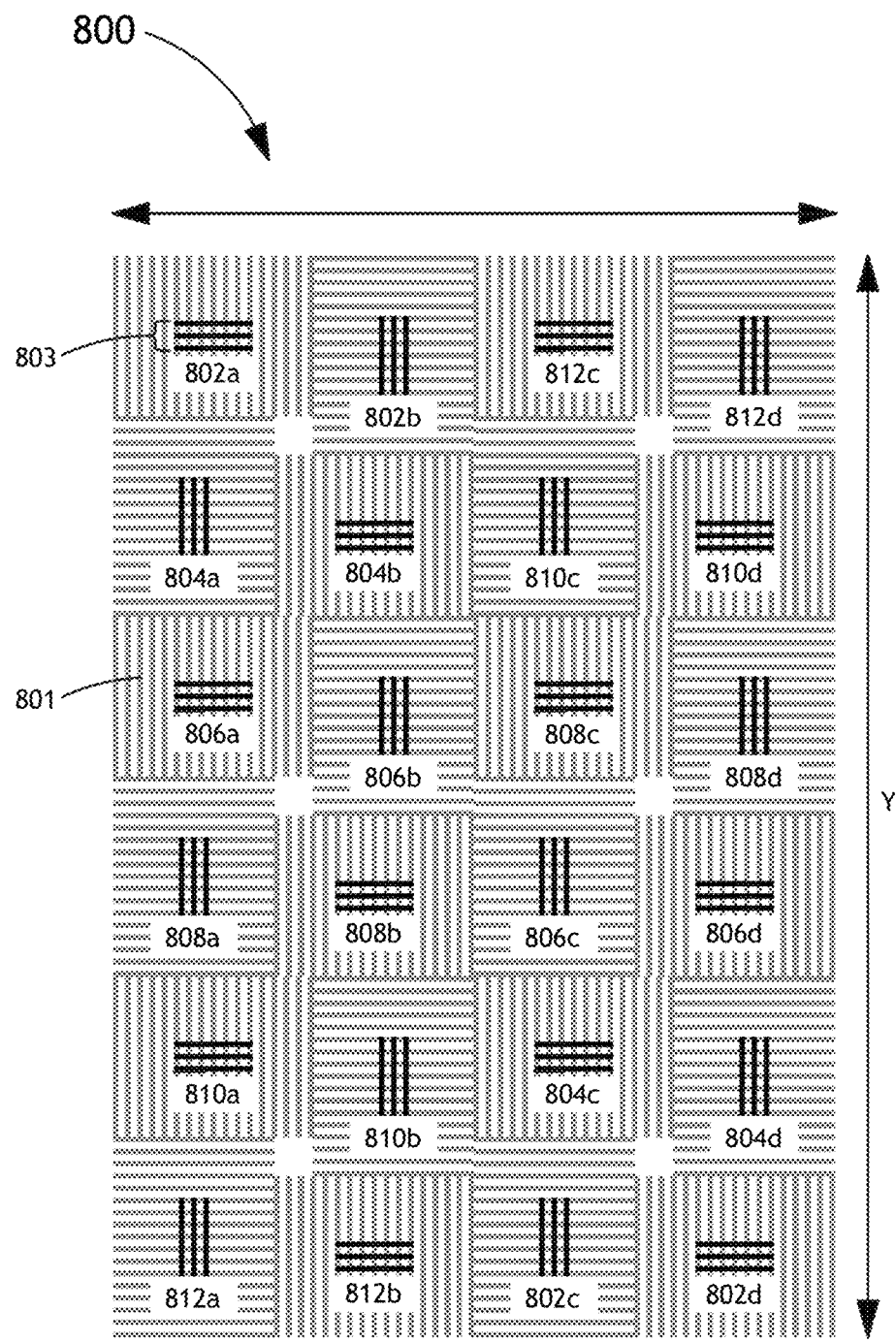
FIG. 8 is a top plan view of a multi-layer overlay target printed in the presence of dummy fill, in accordance with one embodiment of the present invention.

FIG. 8 illustrates a top plan view of overlay target 800 in the presence of dummy fill 801, in accordance with an alternate embodiment of the present invention. It should be recognized that the overlay targets 400, 500, and 501, wherein X-overlay and Y-overlay measurements are performed utilizing different pattern elements, allow for overlay metrology measurement processes in the presence of dummy fill 801. For example, FIG. 8 depicts an overlay target 800 implemented in the presence of dummy fill 801. For instance, overlay target 800 includes six target structures, with each target structure including four pattern elements. In this manner, the first structure includes pattern elements 802a . . . 802d, the second structure includes pattern elements 804a . . . 804d, the third structure includes pattern elements 806a . . . 806d, the fourth structure includes pattern elements 808a . . . 808d, the fifth structure includes pattern elements 810a . . . 810d, and the sixth structure includes pattern elements 812a . . . 812d. Moreover, it is pointed out that in the example of FIG. 8 two of the pattern elements of each structure are designated for X-overlay measurement (e.g., 802a, 806a, or 810a), while the remaining two pattern elements of each target structure are designated for Y-overlay measurement (e.g., 812d, 808d, or 804d).

In a further embodiment, the pattern elements (e.g., 802a . . . 812d) of target 800 each include a plurality of sub-elements 803. For example, as illustrated in FIG. 8, each pattern element (e.g., 802a . . . 812d) may include three parallel thin rectangular shaped and periodically spaced sub-elements 803. It should be noted that the shape and arrangement of the sub-elements 803 depicted in FIG. 8 does not represent a limitation but rather should be interpreted as illustrative.

It is further recognized that the dummy fill 801 may consist of a periodic grating structure printed above or below the overlay target 800 as illustrated by the FIG. 8.

In a further embodiment, the sub-elements 803 of each pattern element (e.g., 802a . . . 812d) of each structure may be aligned orthogonally with the grating structure of the dummy fill 801 structure. In this regard, the lines of the dummy fill 801 run perpendicularly to the lines of the sub-element 803 structure. Applicant notes that by aligning the sub-elements 803 of the pattern elements (e.g., 802a . . . 812d) orthogonally to the dummy fill structure 801 mitigates the risk of contamination of the metrology signal of a given overlay target with information from the underlying dummy fill structure 801.

As in targets 400 and 501 described previously herein, it is further recognized that the overlay target 800 possesses 180 degree rotational symmetry about the common center of symmetry of the constituent target structures of the target, while the individual pattern elements (e.g., 802a . . . 812d) of the target 800 possess 180 degree rotational symmetric about the center of symmetry of each individual pattern element.

In a further embodiment, the periodicity of the sub-elements 803 of the pattern elements (e.g., 802a . . . 812d), the dummy fill structure 801, or both may consist of a resolution below that which is suitable for the implementing metrology system. In particular, the $1^{st}$ and $-1^{st}$ diffraction orders may fall outside the aperture of the objective of the imaging system of the metrology system. It is recognized herein that this feature is particularly advantageous in the case of the dummy fill structure as it further mitigates the risk of contamination of the metrology signal of the target 800 with a signal from the dummy fill pattern 801.

Figure 9:
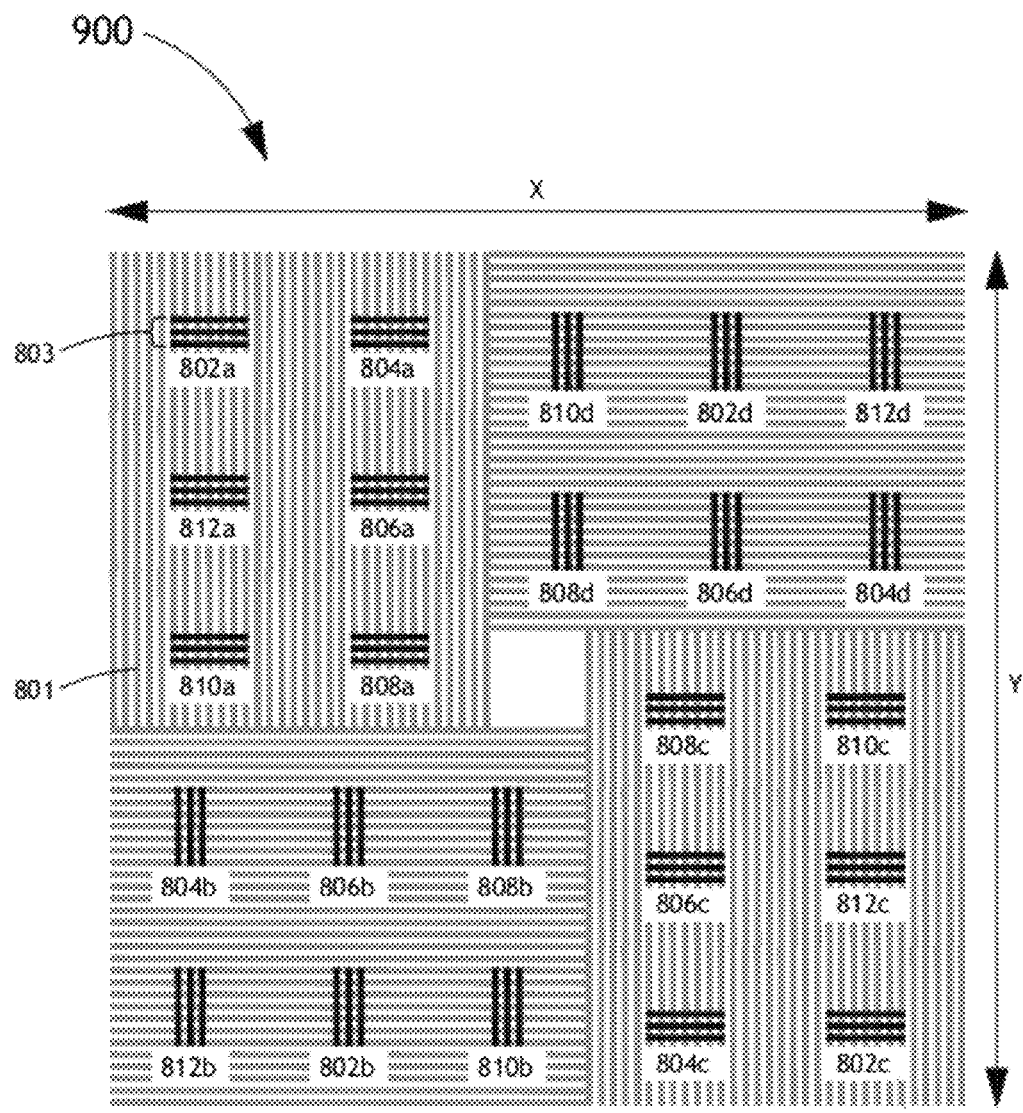
FIG. 9 is a top plan view of a multi-layer overlay target printed in the presence of dummy fill, in accordance with one embodiment of the present invention.

FIG. 9 illustrates a top plan view of overlay target 900 in the presence of dummy fill 801, in accordance with an alternate embodiment of the present invention. Target 900 is similar to target 800 in that it possesses identical symmetry requirements as well as orthogonal pattern element and dummy fill alignment. Target 900, however, illustrates a square dimensioned target suitable for implementation in a metrology process.

Figure 10:
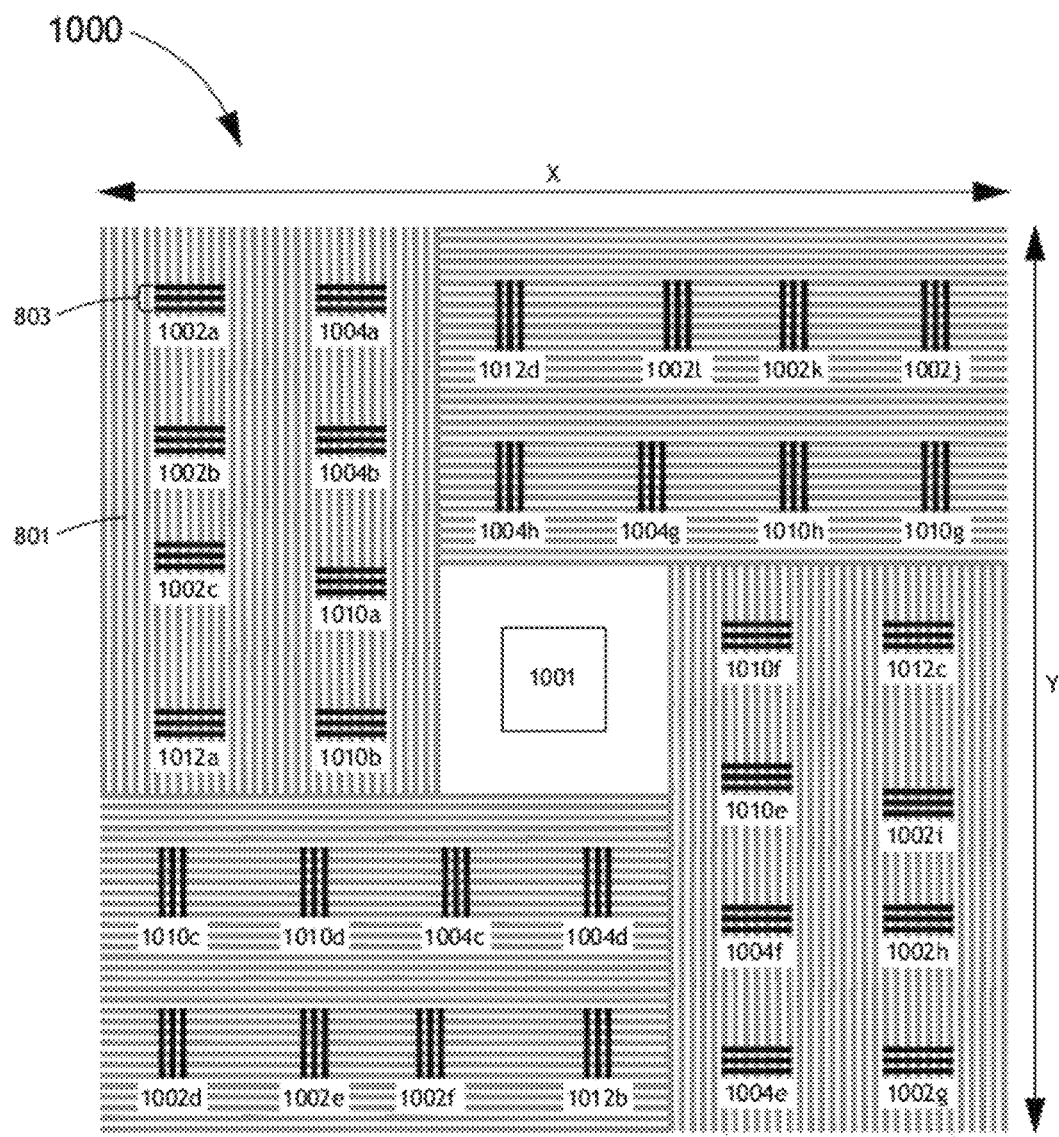
FIG. 10 is a top plan view of a multi-layer overlay target printed in the presence of dummy fill, in accordance with one embodiment of the present invention.

FIG. 10 illustrates a top plan view of overlay target 1000 in the presence of dummy fill 801, in accordance with an alternate embodiment of the present invention. Target 1000 is similar to target 800 in that it possesses identical symmetry requirements as well as orthogonal pattern element and dummy fill alignment. Target 1000, however, illustrates the implementation of contrast enhancement as described previously herein with respect to FIGS. 6 and 7. Furthermore, FIG. 10 illustrates an acquisition mark 1001 located at the center of the overlay target 1000. The acquisition mark 1001 may be utilized to identify the approximate position of the center of the target in order to position the target in the center of the field of view (FOV) of the given metrology tool.

Figure 11:
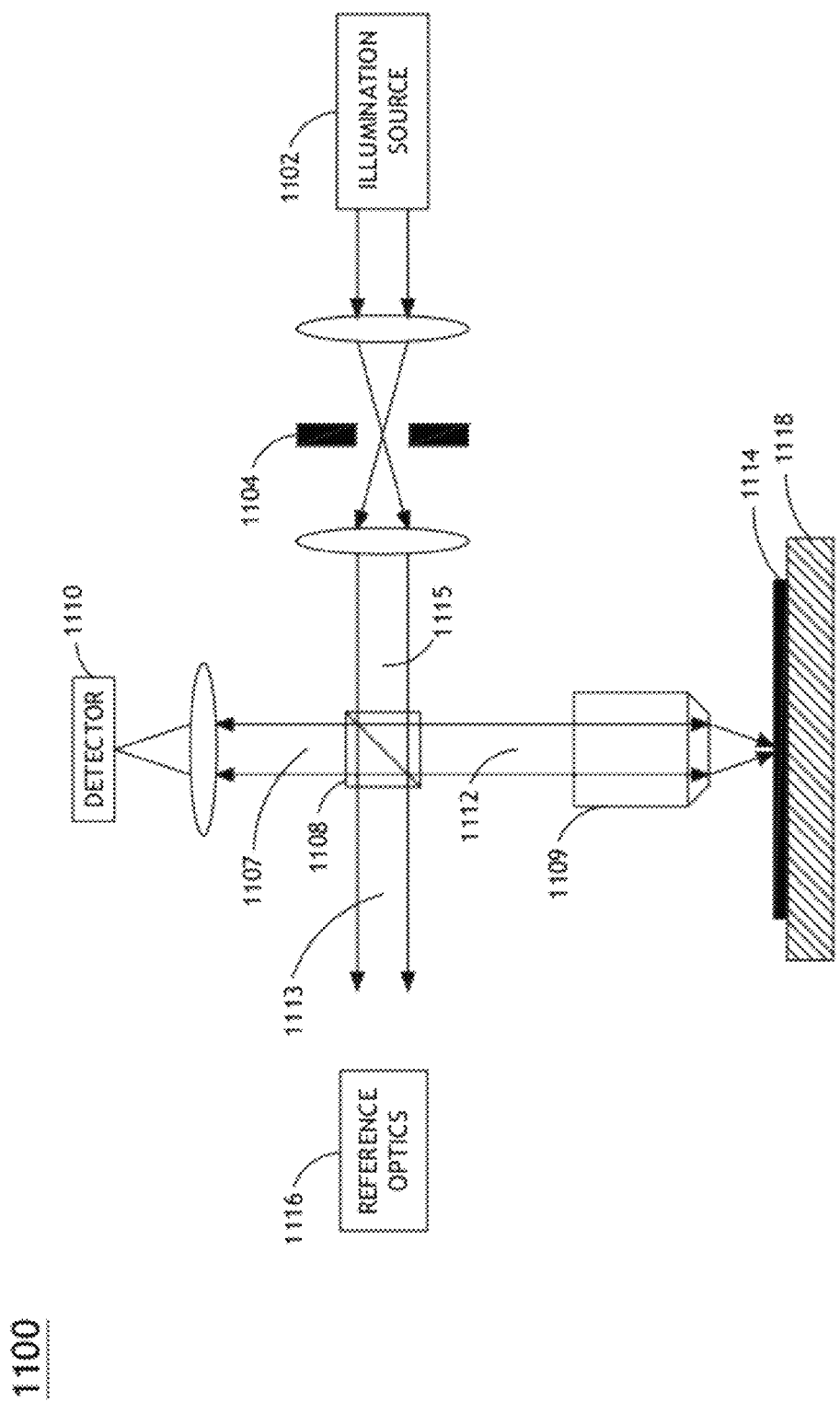
FIG. 11 is a block diagram view of a system suitable contrast enhancement of a multi-layer overlay metrology target.
Figure 12:
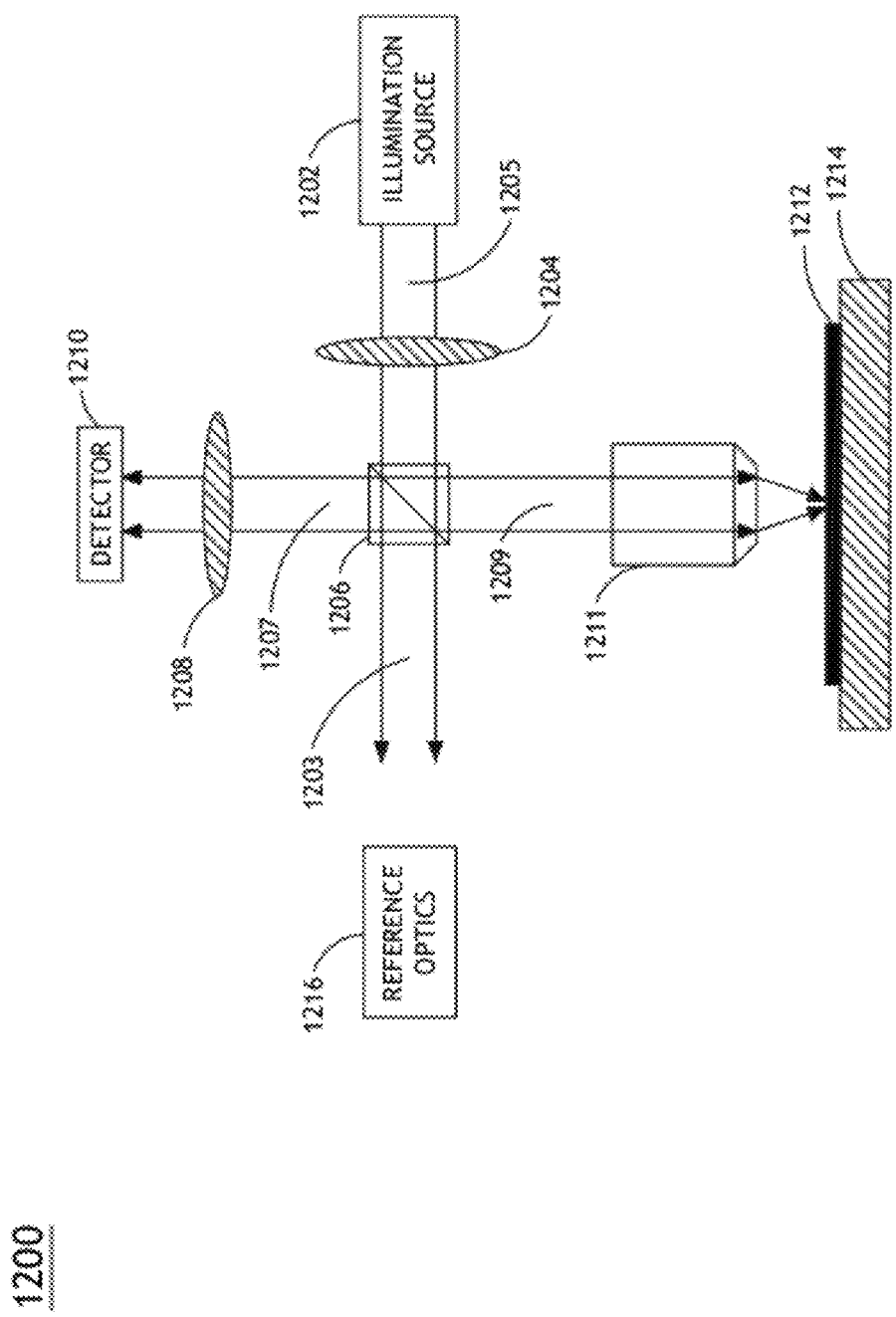
FIG. 12 is a block diagram view of a system suitable contrast enhancement of a multi-layer overlay metrology target.

Referring generally to FIGS. 11 and 12, the systems 1100 and 1200 suitable for contrast enhancement are described in accordance with the present invention. It is contemplated herein that systems 1100 and 1200 of the present invention may enable the implementation of the various multi-layer targets described previously herein. One limitation associated with the multi-layer targets of the present invention includes the potential for lack of information content (i.e., contrast level) associated with their small measurement structures. The systems 1100 and 1200 are directed at providing enhanced contrast levels to counteract the presence of low contrast in one or more target structures of the various multi-layer targets of the present invention. The system 1100 is directed at the utilization of structured illumination in order to enhance the contrast level associated with one or more measurement structures associated with the target structures of the multi-layer targets of the present invention. Moreover, the system 1200 is directed at the utilization of cross-polarization in order to enhance the contrast level associated with one or more measurement structures associated with the target structures of the multi-layer targets of the present invention.

It is contemplated herein that the systems 1100 and 1200 of the present invention may consist (but not required to consist) of adapting or reconfiguring presently existing optical metrology systems. For instance, the present invention may consist of adapting the KLA-Tencor Archer 100 overlay control system. For example, in the case of system 1200, a first linear polarizer may be inserted into an illumination path of a traditional system (e.g., Archer 100 system), while a second linear polarizer is placed within the imaging path of the traditional system. In the case of system 1100, an aperture may be inserted at a pupil plane of an illumination path of a traditional system (e.g., Archer 100 system). It should be recognized that the present invention is not limited to an adaptation of an Archer 100 system, but rather the description above should be interpreted merely as an illustration. It is anticipated that the present invention may be extended to a wide variety of microscopy and overlay metrology systems.

Referring now to FIG. 11, the system 1100 suitable for contrast enhancement of a multi-layer overlay metrology target may include an illumination source 1102, an aperture 1104, a beam splitter 1108, and a detector 1110 configured to receive light reflected from one or more specimens 1114 (e.g., one or more wafers of a wafer lot).

The illumination source 1102 of the system 1100 may include any illumination source known in the art. In one embodiment, the illumination source 1102 may include a broadband light source (e.g., white light source). For example, the illumination source 1102 may include, but is not limited to, a halogen light source (HLS). For instance, the halogen light source may include, but is not limited to, a tungsten based halogen lamp. In another example, the illumination source 1102 may include a Xenon arc lamp.

In another aspect of the present invention, the beam splitter 1108 of the system 1100 may split the light beam emanating from an illumination source 1102, after passing through the aperture, into two paths: an object path 1112 and a reference path 1113. In this sense, the object path 1112 and the reference path 113 of the system 100 may form a portion of a two beam interference optical system. For example, the beam splitter 1108 may direct a first portion of the beam of light from the illumination path 1115 along the object path 1112, while allowing a second portion of the beam of light from the illumination path 115 to be transmitted along the reference path 1113. More specifically, the beam splitter 1108 may direct a portion of the light emanating from the illumination source 1102, after passing through the aperture 1104, to the surface of the specimen 1114 (e.g., via object path 1112) disposed on the specimen stage 1118. Moreover, the beam splitter 1108 may transmit a second portion of the light emanating from the illumination source 1102 to the components of the reference path 1113. For instance, the beam splitter 1108 may transmit a portion of light from the illumination path 1115 along the reference path 1113 to a reference mirror (not shown). It should be recognized by those skilled in the art that any beam splitter known in the art is suitable for implementation as the 1 beam splitter 1108 of the present invention.

It should be apparent to those skilled in the art that the reference path 1113 may include, but is not limited to, a reference mirror, a reference objective, and a shutter configured to selectively block the reference path 1113. In a general sense, a two-beam interference optical system may be configured as a Linnik interferometer. Linnik interferometry is described generally in U.S. Pat. No. 4,818,110, issued on Apr. 4, 1989, and U.S. Pat. No. 6,172,349, issued on Jan. 9, 2001, which are incorporated herein by reference.

In another embodiment, the system 1100 may include a main objective lens 1109. The main objective lens 1109 may aid in directing light along the object path 1112 to the surface of the specimen 1114 disposed on the specimen stage 1118. For example, the beam splitter 1108 may direct a portion of the light beam 1115 emanating from the illumination source 1102, after passing through the aperture 1104, along the object path 1112. Following the splitting process by the beam splitter 1108, the main objective lens 1109 may focus light from the object path 1112, which is collinear with the primary optical axis 1107, onto the surface of the specimen 1114. In a general sense, any objective lens known in the art may be suitable for implementation as the main objective lens 1109 of the present invention.

Further, a portion of the light impinging on the surface of the specimen 1114 may be reflected by the specimen 1114 and directed along the primary optical axis 1107 via the objective 1109 and the beam splitter 1108 toward the detector 1110. It should be further recognized that intermediate optics devices such as intermediate lenses, additional beam splitters (e.g., a beam splitter configured to split off a portion of light to a focusing system), and imaging lenses 1106 may be placed between the objective 1109 and the imaging plane of the detector 1110.

In another aspect of the present invention, the detector 1110 of the system 1100 may be disposed along the primary optical axis 1107 of the system 1100. In this regard, the camera 1110 may be arranged to collect imagery data from the surface of the specimen 1114. For example, in a general sense, after reflecting from the surface of the specimen 1114, light may travel along the primary optical axis 1107 to the image plane of the detector 1110 via the main objective 1109 and the beam splitter 1108. It is recognized that any detector system known in the art is suitable for implementation in the present invention. For example, the detector 1110 may include a charge coupled device (CCD) based camera system. By way of another example, the detector 1110 may include a time delay integration (TDI)-CCD based camera system. In a further aspect, the detector 1110 may be communicatively coupled with a computer system (not shown). In this regard, digitized imagery data may be transmitted from the detector 1110 to the computer system via a signal, such as a wireline signal (e.g., copper line, fiber optic cable, and the like) or a wireless signal (e.g., wireless RF signal).

While the above description describes the detector 1110 as being located along the primary optical axis 1107 of the system 1100, this characteristic should not be interpreted as a requirement. It is contemplated herein that the detector 1110 may reside along an additional optical axis of the system 1100. For example, in a general sense, one or more additional beam splitters may be utilized to divert a portion of light reflected from the surface of the specimen 1114 and traveling along the object path 1112 onto an additional optical axis, which non-parallel to the object path 1112. The camera 1110 may be arranged such that light traveling along the additional optical axis impinges the image plane of the camera 1110.

In one aspect of the present invention the aperture 1104 may be position at a pupil plane of the illumination path 1115. In this regard, the aperture 1104 may be configured to have a well-defined shape in order to select an predetermined illumination angle of the illumination emanating from the illumination source 1102. The illumination angle is selected so as to achieve a selected contrast level at an imaging plane of the detector 1110.

In one embodiment, the aperture may have a geometric shape or a combination of geometric shapes. For example, the aperture may have an 'X' shape or a 'cross' shape. In another example, the aperture may have a ring shape. It is further recognized herein that these shapes may be achieved via diffractive optical elements.

In another embodiment, the illumination path may include a plurality of apertures. In this regard, one of the plurality of apertures may be selected during recipe training in order to optimize the contrast level for a specific stack and target design. It is recognized herein that this may be done utilizing a trial and error method. In another embodiment, the aperture 1104 may include a tunable aperture. For example, the aperture 1104 may consist of a tunable aperture that may be programmed by a user in order to produce a plurality of selectable illumination structures. In this regard, a programmed tunable aperture may be tuned in a manner to optimize the contrast for a specific stack or target design. For instance, the tunable aperture may include, but is not limited to, a micro mirror array.

Referring now to FIG. 12, the system 1200 suitable for contrast enhancement of a multi-layer overlay metrology target may include an illumination source 1202, a first polarizer 1204, a beam splitter 1206, a second polarizer 1208 and a detector 1210 configured to receive light reflected from one or more specimens 1212 (e.g., one or more wafers of a wafer lot).

It is recognized herein that the illumination source 1202, the beam splitter 1206, the detector of 1210, the specimen stage 1214, and the reference path 1216 are similar to the illumination source 1102, the beam splitter 1108, the detector of 1110, the specimen stage 1118, and the reference path of 1113 of system 1100. As such, the description of system 1100 should be interpreted to extend to system 1200 except where otherwise noted.

In one aspect, the first polarizer 1204 is arranged to polarize light emanating from the illumination source 1202. For example, the first 1204 may be disposed along an illumination path 1205 such that light emanating from the illumination source 1202 may be polarized by the first polarizer 1204.

In another aspect, the second polarizer 1208 may be arranged to serve as an analyzer for light reflected from the specimen 1212. In this regard, the first polarizer 1204 and the second polarizer 1208 may configured be such that the amount of light reflected from unpatterned parts of the specimen 1212 or from periodic unresolved patterns of the specimen 1212 that reaches the imaging plane of the detector 1210 is minimized. In one embodiment, the first polarizer 1204 and the second polarizer 1208 may both include linear polarizers. In the case of linear polarizers, the first polarizer 1204 and the second polarizer 1208 may be arranged such that their polarizing axes are substantially perpendicular to one another. As a result of this configuration, the majority of reflected light reaching the imaging plane of the detector 1210 consists of light reflected from patterns of the specimen 1212 resolved by the metrology tool, enhancing the contrast significantly. In further another, the first polarizer 1204 may include a polarizer configured to transmit only radially polarized light, while the second polarizer is configured to transmit only azimuthally polarized light.

It should be further recognized that the signal from unpatterned portions of the specimen 1212 may be minimized in a variety of other manners. For example, it is recognized herein that a combination of wave-plates and polarizers may be implemented to achieve the results illustrated above. For instance, a first polarizer 1204 and first quarter-wave plate (not shown) oriented at 45 degrees with respect to the first polarizer may be positioned in the illumination path 1205, while a second polarizer 1208 and a second quarter-wave plate (not shown) oriented at 45 degree with respect to the second polarizer may be positioned along the imaging path 1209. Those skilled in the art will recognize that this arrangement may lead to a minimization of the amount light reflected from unpatterned portions of the specimen 1212 which reaches the imaging plane of the detector 1210.

It is further recognized that any combination of polarizers and wave-plates (e.g., half-wave plate) which creates the cross-polarization effect as described above may be suitable for implementation in the present invention.

Figure 13C:
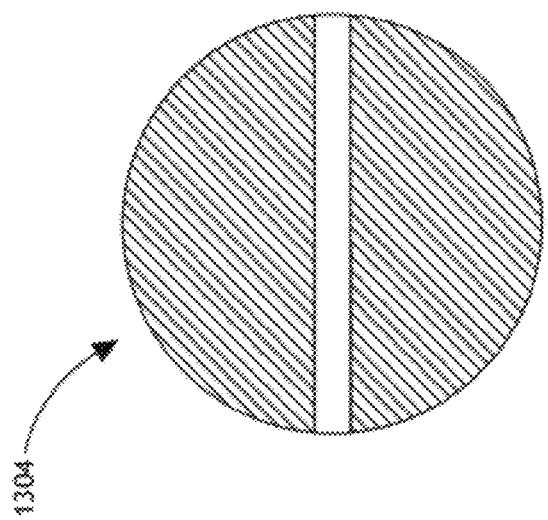
FIG. 13C is a schematic view of an illumination pupil structure suitable for contrast enhancement, in accordance with one embodiment of the present invention.
Figure 13B:
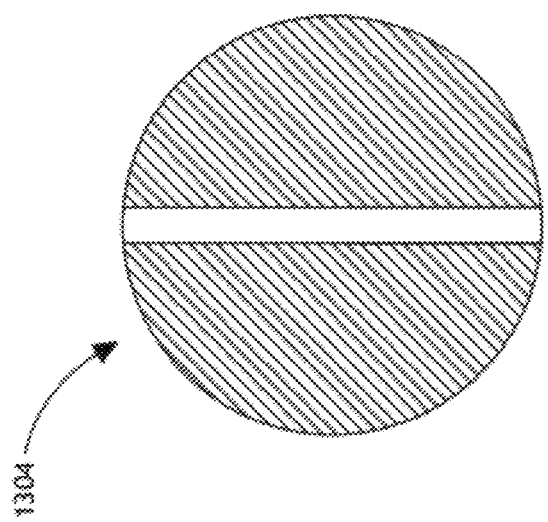
FIG. 13B is a schematic view of an illumination pupil structure suitable for contrast enhancement, in accordance with one embodiment of the present invention.
Figure 13A:
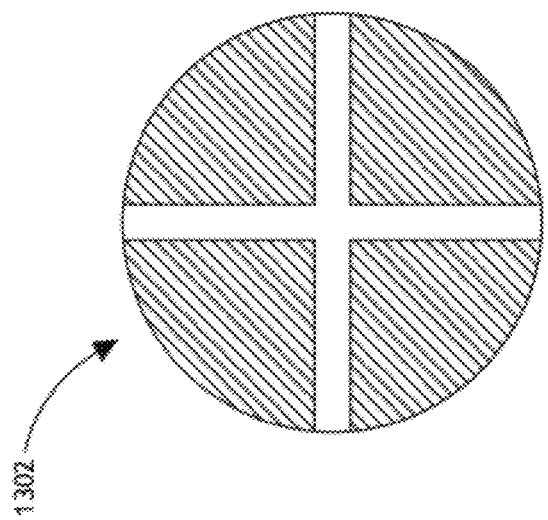
FIG. 13A is a schematic view of an illumination pupil structure suitable for contrast enhancement, in accordance with one embodiment of the present invention.

It is further contemplated herein that the systems 1100 and 1200 may be utilized in combination to improve the level of contrast. In this regard, the present invention may be utilized to ensure a low level of intensity at a point of symmetry of the target. It is recognized herein that the combination of structured illumination and cross-polarization aspects of the present invention may be implemented utilizing the illumination pupils illustrated in FIG. 13. For example, a suitable illumination pupil may have a cross-shape 1302, a vertical line shape 1304 (e.g., Y-direction), or a horizontal line shape 1306 (e.g., X-direction). Moreover, the illumination pupils 1302, 1304, and 1306 may be implemented in combination with an illumination polarizer and an imaging polarizer. In a first embodiment, the pupils 1302-1306 may be implemented in concert with a X-polarizer disposed within the illumination path (e.g., 1115 or 1205) of the system and a Y-polarizer disposed within the imaging path (e.g., 1107 or 1207) of the system. In a second embodiment, the pupils 1302-1306 may be implement in concert with a Y-polarizer disposed within the illumination path of the system and a X-polarizer disposed within the imaging path of the system.

All of the system and methods described herein may include storing results of one or more steps of the method embodiments in a storage medium. The results may include any of the results described herein and may be stored in any manner known in the art. The storage medium may include any storage medium described herein or any other suitable storage medium known in the art. After the results have been stored, the results can be accessed in the storage medium and used by any of the method or system embodiments described herein, formatted for display to a user, used by another software module, method, or system, etc. Furthermore, the results may be stored "permanently," "semi-permanently," temporarily, or for some period of time. For example, the storage medium may be random access memory (RAM), and the results may not necessarily persist indefinitely in the storage medium.

Those having skill in the art will appreciate that there are various vehicles by which processes and/or systems and/or other technologies described herein can be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; alternatively, if flexibility is paramount, the implementer may opt for a mainly software implementation; or, yet again alternatively, the implementer may opt for some combination of hardware, software, and/or firmware. Hence, there are several possible vehicles by which the processes and/or devices and/or other technologies described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary. Those skilled in the art will recognize that optical aspects of implementations will typically employ optically-oriented hardware, software, and or firmware.

Those skilled in the art will recognize that it is common within the art to describe devices and/or processes in the fashion set forth herein, and thereafter use engineering practices to integrate such described devices and/or processes into data processing systems. That is, at least a portion of the devices and/or processes described herein can be integrated into a data processing system via a reasonable amount of experimentation. Those having skill in the art will recognize that a typical data processing system generally includes one or more of a system unit housing, a video display device, a memory such as volatile and non-volatile memory, processors such as microprocessors and digital signal processors, computational entities such as operating systems, drivers, graphical user interfaces, and applications programs, one or more interaction devices, such as a touch pad or screen, and/or control systems including feedback loops and control motors (e.g., feedback for sensing position and/or velocity; control motors for moving and/or adjusting components and/or quantities). A typical data processing system may be implemented utilizing any suitable commercially available components, such as those typically found in data computing/communication and/or network computing/communication systems.

The herein described subject matter sometimes illustrates different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected", or "coupled", to each other to achieve the desired functionality, and any two components capable of being so associated can also be viewed as being "couplable", to each other to achieve the desired functionality. Specific examples of couplable include but are not limited to physically mateable and/or physically interacting components and/or wirelessly interactable and/or wirelessly interacting components and/or logically interacting and/or logically interactable components.

While particular aspects of the present subject matter described herein have been shown and described, it will be apparent to those skilled in the art that, based upon the teachings herein, changes and modifications may be made without departing from the subject matter described herein and its broader aspects and, therefore, the appended claims are to encompass within their scope all such changes and modifications as are within the true spirit and scope of the subject matter described herein.

Although particular embodiments of this invention have been illustrated, it is apparent that various modifications and embodiments of the invention may be made by those skilled in the art without departing from the scope and spirit of the foregoing disclosure. Accordingly, the scope of the invention should be limited only by the claims appended hereto.

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes.

Furthermore, it is to be understood that the invention is defined by the appended claims.

What is claimed:

1. A multilayer overlay target, comprising:
a plurality of target structures including three or more target structures, the three or more target structures including a first target structure, a second target structure and at least a third target structure, wherein at least some of the target structures include a set of two or more pattern elements, wherein the three or more target structures are configured to share a common center of symmetry upon alignment of the three or more target structures, wherein at least one of the target structures is invariant to 90 degree rotation about the common center of symmetry, wherein the first target structure is disposed in a first process layer, wherein the second target structure is disposed in a second process layer different from the first process layer, wherein at least the third target structure is disposed in at least a third process layer, the at least a third process layer different from the first process layer and the second process layer, wherein a first particular pattern element of the set of two or more pattern elements includes three or more sub-elements and at least a second particular pattern element of the set of two or more pattern elements includes three or more sub-elements, wherein at least one of the three or more sub-elements of the first particular pattern element or the three or more sub-elements of the at least the second particular pattern element comprise a set of three or more parallel line structures aligned along a selected direction and distributed along a direction orthogonal to the selected direction.

2. The multilayer overlay target of claim 1, wherein a first pattern element of the set of two or more pattern elements is suitable for overlay metrology measurements in a first direction and a second pattern element of the set of two or more pattern elements is suitable for overlay metrology measurements in a second direction different from the first direction.

3. The multilayer overlay target of claim 1, wherein a set of pattern elements suitable for overlay metrology measurements in a first direction and a second set of pattern elements suitable for overlay metrology measurements in a second direction different from the first direction have a common center of symmetry.

4. The multilayer overlay target of claim 1, wherein the set of two or more pattern elements of each target structure are printed above or below a layer of dummy fill.

5. The multilayer overlay target of claim 1, wherein some of the plurality of target structures include an additional set of pattern elements in order to enhance contrast of the some of the plurality of target structures.

6. The multilayer overlay target of claim 1, wherein at least some of the two or more pattern elements of each target structure are invariant to 180 degree rotation about an individual center of symmetry and variant to 90 degree rotation about the individual center of symmetry.

7. The multilayer overlay target of claim 1, wherein the first target structure is invariant to 90 degrees rotation about the common center of symmetry, wherein the second target structure and at least the third target structure are invariant to 180 degrees rotation about the common center of symmetry and variant to 90 degrees rotation about the common center of symmetry.

8. The multilayer overlay target of claim 1, wherein the first target structure is configured to measure overlay in a first direction and a second direction perpendicular to the first direction, wherein the second target structure is configured to measure overlay in the first direction and the third target structure is configured to measure overlay in the second direction.

9. The multilayer overlay target of claim 1, wherein the first target structure is invariant to 90 degree rotation about a common center of symmetry, wherein at least one of the second target structure or the third target structure is invariant to 180 degree rotation about the common center of symmetry and variant to 90 degree rotation about the common center of symmetry, wherein each of the two or more pattern elements of each target structure is invariant to 180 degree rotation about an individual center of symmetry and variant to 90 degree rotation about the individual center of symmetry.

10. The multilayer overlay target of claim 1, wherein the three or more sub-elements are arranged parallel to a spacing of the at least one of the pattern elements.

11. The multilayer overlay target of claim 1, wherein the three or more sub-elements are arranged perpendicular to a spacing of the at least one of the pattern elements.

12. The multilayer overlay target of claim 1, wherein the three or more sub-elements are arranged parallel to a first spacing of the at least one of the pattern elements and perpendicular to a second spacing of the at least one of the pattern elements.

13. The multilayer overlay target of claim 1, wherein a spacing associated with the three or more sub-elements is smaller than a spacing between the two or more of the pattern elements.

14. The multilayer overlay target of claim 1, wherein at least some of the two or more pattern elements have an individual center of symmetry.

15. A multilayer overlay target, comprising:
a plurality of target structures including three or more target structures, the three or more target structures including a first target structure, a second target structure and at least a third target structure, wherein at least some of the target structures include a set of two or more pattern elements, wherein the three or more target structures are configured to share a common center of symmetry upon alignment of the three or more target structures, wherein the first target structure is invariant to a 90 degree rotation about the common center of symmetry, the second target structure is invariant to a 90 degree rotation about the common center of symmetry, and at least the third target structure is invariant to a 90 degree rotation about the common center of symmetry, wherein the first target structure is disposed in a first process layer, wherein the second target structure is disposed in a second process layer different from the first process layer, wherein at least the third target structure is disposed in at least a third process layer, the at least a third process layer different from the first process layer and the second process layer, wherein at least some of the two or more pattern elements have an individual center of symmetry different from the common center of symmetry of the three or more target structures, wherein at least a portion of a pattern element of the first target structure overlaps with at least a portion of a pattern element of at least one of the second target structure or the at least a third target structure.

16. The multilayer overlay target of claim 15, wherein the three or more target structures include at least a fourth target structure.

17. The multilayer overlay target of claim 16, wherein at least the fourth target structure is invariant to a 90 degree rotation about the common center of symmetry.

18. The multilayer overlay target of claim 17, wherein the first target structure, the second target structure, the third target structure and the fourth target structure are configured to measure overlay in a first direction and a second direction perpendicular to the first direction.

19. The multilayer overlay target of claim 15, wherein one or more pattern elements of the first target structure overlaps with one or more pattern elements of at least one of the second target structure or the at least a third target structure.

20. A multilayer overlay target, comprising:
a plurality of target structures including three or more target structures, the three or more target structures including a first target structure, a second target structure and at least a third target structure, wherein at least some of the target structures include a set of two or more pattern elements, wherein at least some of the two or more pattern elements are reflection invariant, wherein at least some of the two or more pattern elements of each target structure are variant to 90 degree rotation about an individual center of symmetry, wherein the two or more pattern elements of the multi-layer overlay target are spatially separated from one another, wherein the three or more target structures are configured to share a common center of symmetry upon alignment of the three or more target structures, wherein the first target structure is disposed in a first process layer, wherein the second target structure is disposed in a second process layer different from the first process layer, wherein at least the third target structure is disposed in at least a third process layer, the at least a third process layer different from the first process layer and the second process layer.

21. A multilayer overlay target, comprising:
a plurality of target structures including three or more target structures, the three or more target structures including a first target structure, a second target structure and at least a third target structure, wherein at least some of the target structures include a set of two or more pattern elements, wherein the two or more pattern elements of the multi-layer overlay target are spatially separated from one another, wherein at least some of the target structures are reflection invariant, wherein at least some of the two or more pattern elements of each target structure are reflection invariant and variant to 90 degree rotation about an individual center of symmetry, wherein the three or more target structures are configured to share a common center of symmetry upon alignment of the three or more target structures, wherein the first target structure is disposed in a first process layer, wherein the second target structure is disposed in a second process layer different from the first process layer, wherein at least the third target structure is disposed in at least a third process layer, the at least a third process layer different from the first process layer and the second process layer.

22. A multilayer overlay target, comprising:
a plurality of target structures including four or more target structures, the four or more target structures including a first target structure, a second target structure, a third target structure and at least a fourth target structure, wherein at least some of the target structures include a set of two or more pattern elements, wherein the two or more pattern elements of the multi-layer overlay target are spatially separated from one another, wherein at least one of the two or more pattern elements are variant to 90 degree rotation about individual centers of symmetry, wherein a location of a center of symmetry of each of the four or more target structures is indicative of an overlay alignment of the four or more target structures, wherein the four or more target structures are configured to share a common center of symmetry upon alignment of the four or more target structures, wherein the first target structure, the second target structure, the third target structure and the fourth target structure are invariant to a 180 degree rotation about the common center of symmetry and variant to a 90 degree rotation about the common center of symmetry, wherein the first target structure is disposed in the first process layer, wherein the second target structure is disposed in the second process layer different from the first process layer, wherein the third target structure is disposed in a third process layer different from the first process layer and the second process layer, wherein the at least the fourth target structure is disposed within the fourth process layer different from the first process layer, the second process layer and the third process layer.

23. The multilayer overlay target of claim 22, wherein at least one of the first target structure or second target structure are configured to measure overlay in a first direction, wherein at least one of the third target structure or the fourth target structure are configured to measure overlay in a second direction perpendicular to the first direction.

24. The multilayer overlay target of claim 22, wherein at least some of the two or more pattern elements of each target structure are invariant to 180 degree rotation about an individual center of symmetry and variant to 90 degree rotation about the individual center of symmetry, wherein the individual center of symmetry of the at least some of the two or more pattern elements is different from the common center of symmetry of the four or more target structures.

\* \* \* \* \*